(12) United States Patent
Ueda

(10) Patent No.: US 10,855,252 B2
(45) Date of Patent: Dec. 1, 2020

(54) ACOUSTIC WAVE DEVICE AND METHOD OF FABRICATING THE SAME, FILTER, AND MULTIPLEXER

(71) Applicant: TAIYO YUDEN CO., LTD., Tokyo (JP)

(72) Inventor: Masanori Ueda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 44 days.

(21) Appl. No.: 16/169,892

(22) Filed: Oct. 24, 2018

(65) Prior Publication Data
US 2019/0149129 A1 May 16, 2019

(30) Foreign Application Priority Data

Nov. 16, 2017 (JP) .................. 2017-220765

(51) Int. Cl.
| | | |
|---|---|---|
| *H03H 9/56* | (2006.01) | |
| *H03H 9/17* | (2006.01) | |
| *H03H 9/02* | (2006.01) | |
| *H03H 3/10* | (2006.01) | |
| *H03H 9/72* | (2006.01) | |
| *H03H 3/02* | (2006.01) | |

(52) U.S. Cl.
CPC .............. *H03H 9/564* (2013.01); *H03H 3/02* (2013.01); *H03H 3/10* (2013.01); *H03H 9/02015* (2013.01); *H03H 9/02574* (2013.01); *H03H 9/175* (2013.01); *H03H 9/568* (2013.01); *H03H 9/725* (2013.01); *H03H 2003/025* (2013.01)

(58) Field of Classification Search
CPC .......... H03H 9/564; H03H 9/175; H03H 3/02; H03H 9/02015; H03H 9/02574; H03H 9/725; H03H 3/10; H03H 9/568; H03H 2003/025
USPC ......................................... 333/133, 187, 188
See application file for complete search history.

(56) References Cited

U.S. PATENT DOCUMENTS

| | | | |
|---|---|---|---|
| 5,929,555 A | 7/1999 | Sugimoto et al. | |
| 2005/0012568 A1* | 1/2005 | Aigner ................. | H03H 9/0095 333/187 |

(Continued)

FOREIGN PATENT DOCUMENTS

| | | |
|---|---|---|
| JP | H10-51262 A | 2/1998 |
| JP | 2007-36915 A | 2/2007 |

(Continued)

*Primary Examiner* — Robert J Pascal
*Assistant Examiner* — Jorge L Salazar, Jr.
(74) *Attorney, Agent, or Firm* — Chen Yoshimura LLP

(57) ABSTRACT

An acoustic wave device includes: a support substrate; a single piezoelectric substrate that is located on the support substrate and is single-crystal; first electrodes located on a first surface of the piezoelectric substrate; second electrodes located on a second surface of the piezoelectric substrate; and an acoustic mirror that is bonded on the support substrate, is located between the support substrate and the first electrodes in resonance regions where the first electrodes and the second electrodes face each other across at least a part of the piezoelectric substrate, is not located between the support substrate and the first electrodes in at least a part of a region between the resonance regions, and reflects an acoustic wave propagating through the piezoelectric substrate.

20 Claims, 20 Drawing Sheets

(56) References Cited

U.S. PATENT DOCUMENTS

| | | | |
|---|---|---|---|
| 2007/0210878 A1* | 9/2007 | Yamaguchi | H03H 3/02 |
| | | | 333/187 |
| 2012/0198672 A1 | 8/2012 | Ueda et al. | |
| 2013/0271238 A1 | 10/2013 | Onda et al. | |
| 2013/0278356 A1* | 10/2013 | Meltaus | H03H 9/564 |
| | | | 333/187 |
| 2017/0214388 A1* | 7/2017 | Irieda | H03H 9/205 |

FOREIGN PATENT DOCUMENTS

| JP | 2010-136317 A | 6/2010 |
|---|---|---|
| JP | 2012-165132 A | 8/2012 |
| JP | 2013-223025 A | 10/2013 |

* cited by examiner

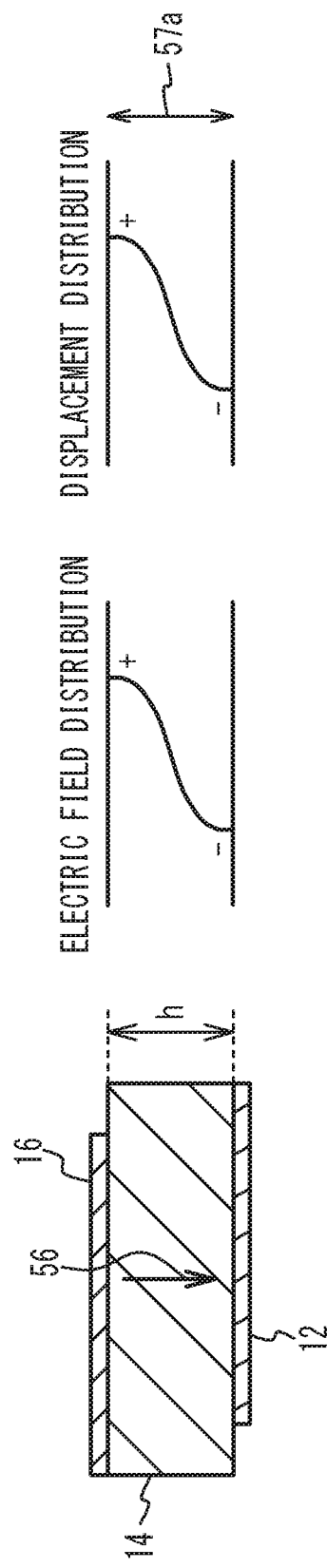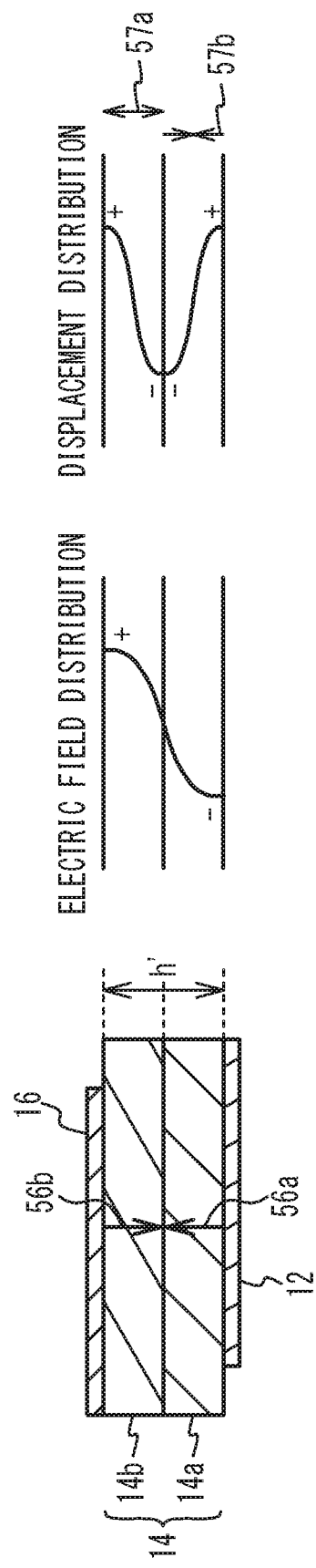

ACOUSTIC WAVE DEVICE AND METHOD OF FABRICATING THE SAME, FILTER, AND MULTIPLEXER

CROSS-REFERENCE TO RELATED APPLICATION

This application is based upon and claims the benefit of priority of the prior Japanese Patent Application No. 2017-220765, filed on Nov. 16, 2017, the entire contents of which are incorporated herein by reference.

FIELD

A certain aspect of the present invention relates to an acoustic wave device and a method of fabricating the same, a filter, and a multiplexer.

BACKGROUND

Acoustic wave devices including piezoelectric thin film resonators have been used as filters and multiplexers for wireless devices such as, for example, mobile phones. It has been known to use a single-crystal piezoelectric substrate as a piezoelectric layer of the piezoelectric thin film resonator as disclosed in, for example, Japanese Patent Application Publication Nos. 2012-16512, 2010-136317, 2013-223025, and H10-51262. It has been known to stack piezoelectric layers having opposite polarization directions as disclosed in, for example, Japanese Patent Application Publication Nos. 2012-165132, H10-51262, and 2007-36915.

SUMMARY OF THE INVENTION

According to a first aspect of the present invention, there is provided an acoustic wave device including: a support substrate; a single piezoelectric substrate that is located on the support substrate and is single-crystal; first electrodes located on a first surface of the piezoelectric substrate; second electrodes located on a second surface of the piezoelectric substrate; and an acoustic mirror that is bonded on the support substrate, is located between the support substrate and the first electrodes in resonance regions where the first electrodes and the second electrodes face each other across at least a part of the piezoelectric substrate, is not located between the support substrate and the first electrodes in at least a part of a region between the resonance regions, and reflects an acoustic wave propagating through the piezoelectric substrate.

According to a second aspect of the present invention, there is provided a filter including the above acoustic wave device.

According to a third aspect of the present invention, there is provided a multiplexer including the above filter.

According to a fourth aspect of the present invention, there is provided a method of fabricating an acoustic wave device, the method including: forming first electrodes on a first surface of a single piezoelectric substrate that is single-crystal; forming second electrodes on a second surface of the piezoelectric substrate so that resonance regions where the first electrodes and the second electrodes face each other across at least a part of the piezoelectric substrate are formed; forming an acoustic mirror, which reflects an acoustic wave propagating through the piezoelectric substrate, on the first surface so that the acoustic mirror covers the first electrodes; leaving the acoustic mirror in regions to be the resonance regions, and removing the acoustic mirror in at least a part of a region between the regions to be the resonance regions; and bonding the acoustic mirror to a support substrate after the removing of the acoustic mirror.

BRIEF DESCRIPTION OF THE DRAWINGS

FIG. 15A and FIG. 15B illustrate piezoelectric substrates of the first embodiment and the second variation of the first embodiment, respectively;

DETAILED DESCRIPTION

The use of a single-crystal piezoelectric substrate as the piezoelectric layer of the piezoelectric thin film resonator improves the characteristics of the piezoelectric thin film resonator. It is difficult to form the single-crystal piezoelectric substrate made of lithium tantalate or lithium niobate on a support substrate. Thus, in Japanese Patent Application Publication No. 2012-165132, a single piezoelectric substrate having a plurality of piezoelectric thin film resonators is attached to the support substrate. However, a fabrication step of forming a hollow becomes complicating, and damage and/or distortion tends to be introduced into the piezoelectric substrate having the piezoelectric thin film resonators formed thereon.

Hereinafter, embodiments of the present invention will be described with reference to the accompanying drawings.

First Embodiment

Figure 1:
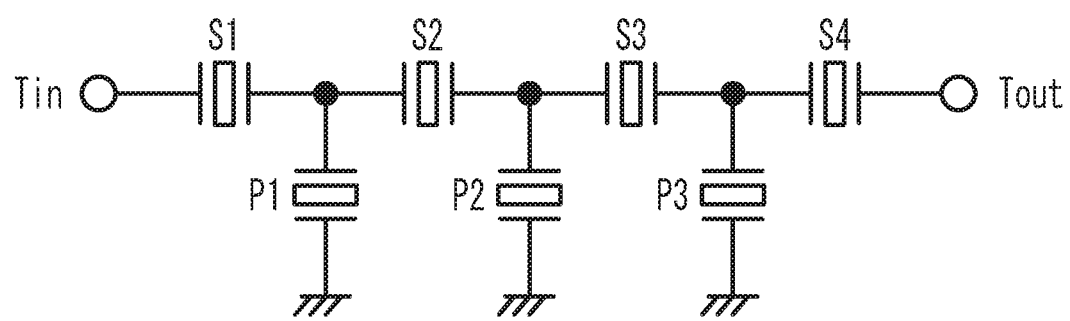
FIG. 1 is a circuit diagram of a ladder-type filter in a first embodiment.

A ladder-type filter will be described as an example of the acoustic wave device. FIG. 1 is a circuit diagram of a ladder-type filter in a first embodiment. As illustrated in FIG. 1, series resonators S1 through S4 are connected in series and the parallel resonators P1 through P3 are connected in parallel between an input terminal Tin and an output terminal Tout.

Figure 2:
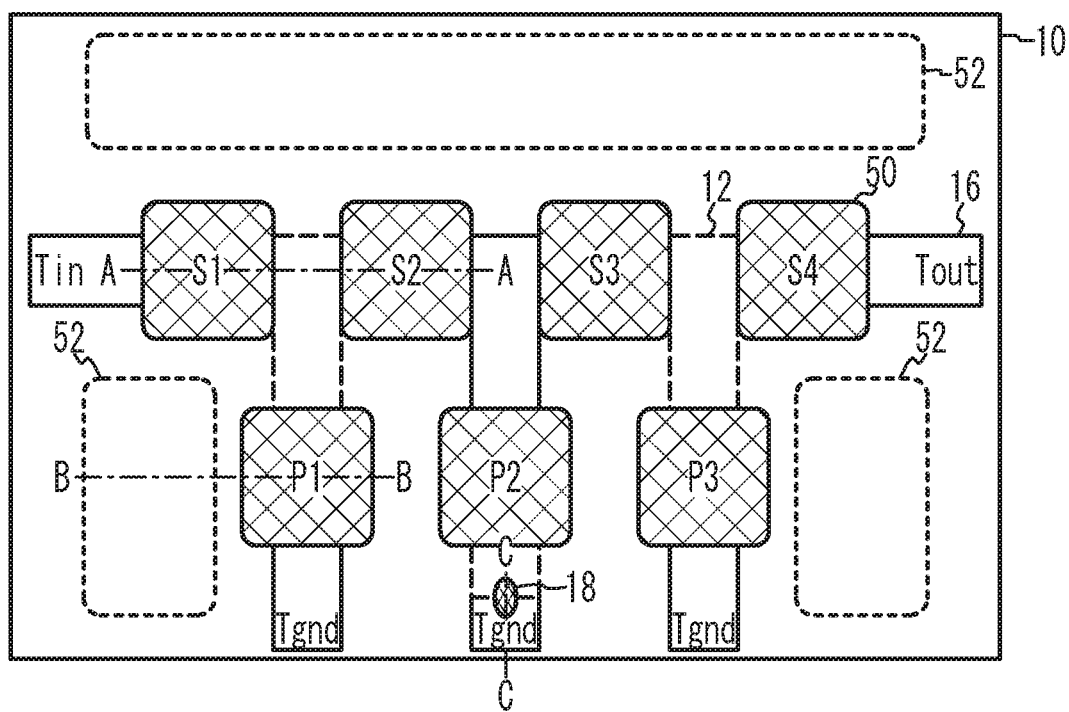
FIG. 2 is a plan view of an acoustic wave device in accordance with the first embodiment.
Figure 3A:
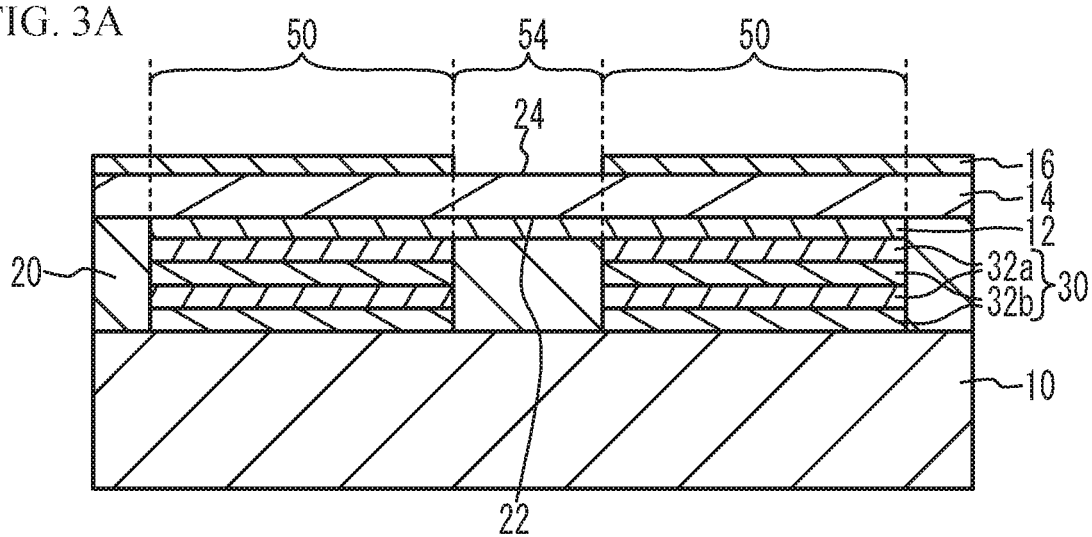
FIG. 3A is a cross-sectional view taken along line A-A in FIG. 2.
Figure 3B:
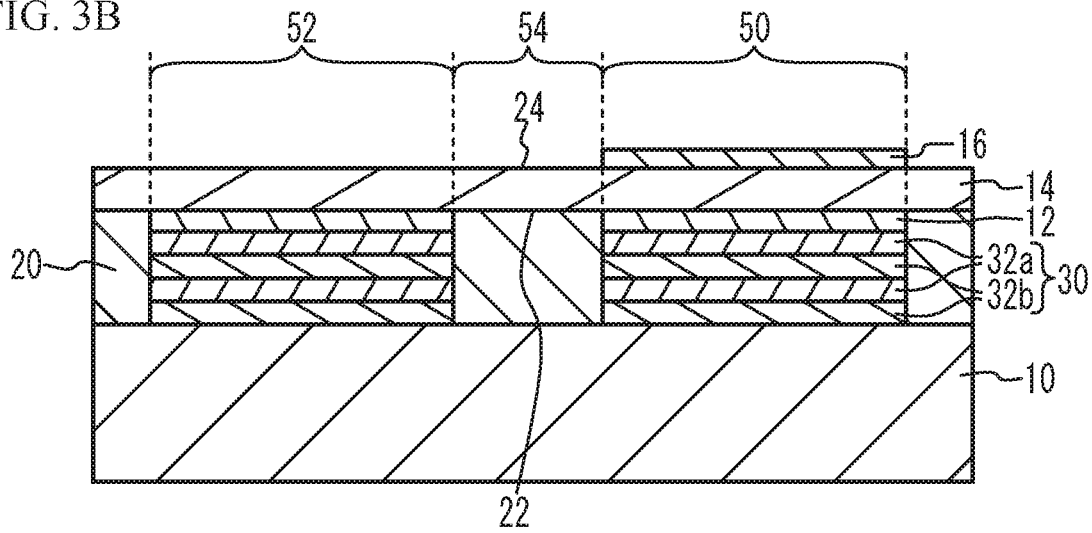
FIG. 3B is a cross-sectional view taken along line B-B in FIG. 2.
Figure 3C:
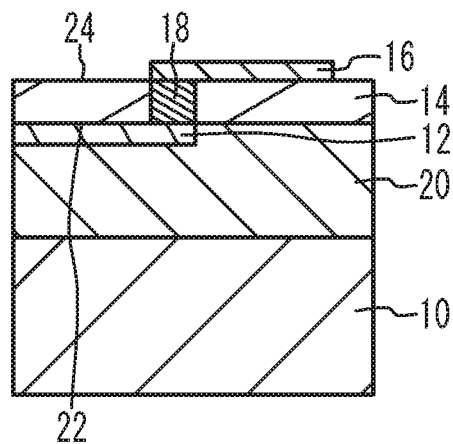
FIG. 3C is a cross-sectional view taken along line C-C in FIG. 2.

FIG. 2 is a plan view of an acoustic wave device in accordance with the first embodiment. FIG. 3A is a cross-sectional view taken along line A-A in FIG. 2, FIG. 3B is a cross-sectional view taken along line B-B in FIG. 2, and FIG. 3C is a cross-sectional view taken along line C-C in FIG. 2. As illustrated in FIG. 3A, an acoustic mirror 30 and an insulating film 20 are located on a support substrate 10. Lower electrodes 12 are located on the acoustic mirror 30 and the insulating film 20. A piezoelectric substrate 14 is located on the lower electrodes 12. Upper electrodes 16 are located on the piezoelectric substrate 14.

The support substrate 10 is an insulating substrate such as, for example, a silicon substrate, an alumina substrate, a quartz substrate, a spinel substrate, a glass substrate, or a crystal substrate. The upper surface of the support substrate 10 is, for example, flat. The acoustic mirror 30 includes first films 32a and second films 32b alternately stacked. The acoustic impedance of the second film 32b is higher than the acoustic impedance of the first film 32a. The first film 32a and the second film 32b are, for example, insulating films or metal films. The first film 32a is, for example, a silicon oxide film, and the second film 32b is, for example, a tungsten (W) film, a ruthenium (Ru) film, or a molybdenum (Mo) film. When the wavelength of the acoustic wave in the primary mode propagating through the piezoelectric substrate 14 in the longitudinal direction is represented by $\lambda$, the film thickness of each of the first film 32a and the second film 32b is approximately $\frac{1}{4}\lambda$. The insulating film 20 is a film more flexible than the acoustic mirror 30 (i.e., a film having a less Young's modulus), and is, for example, a resin film such as a polyimide film.

The piezoelectric substrate 14 is single-crystal, and is shared by the piezoelectric thin film resonators. That is, the piezoelectric substrate 14 is a single substrate. A lower surface 22 and an upper surface 24 of the piezoelectric substrate 14 are flat. The piezoelectric substrate 14 is, for example, a single-crystal lithium tantalate substrate, a single-crystal lithium niobate substrate, a single-crystal aluminum nitride substrate, or a single-crystal crystal substrate. The lithium tantalate substrate or the lithium niobate substrate are, for example, an X-cut substrate (i.e., the normal direction of the upper surface of the piezoelectric substrate 14 corresponds to the X-axis orientation of the crystal orientation). The piezoelectric substrate 14 has a film thickness of approximately $\frac{1}{2}\lambda$.

The lower electrodes 12 are located on the lower surface 22 of the piezoelectric substrate 14, and the upper electrodes 16 are located on the upper surface 24. The region where the lower electrode 12 and the upper electrode 16 face each other across at least a part of the piezoelectric substrate 14 is a resonance region 50. The resonance region 50 is a region in which the acoustic wave resonates in the longitudinal direction. The planar shape of the resonance region 50 is, for example, an elliptical shape, a circular shape, or a polygonal shape. The lower electrode 12 and the upper electrode 16 are formed of a single-layer metal film made of, for example, Ru, chrome (Cr), aluminum (Al), titanium (Ti), copper (Cu), Mo, W, tantalum (Ta), platinum (Pt), rhodium (Rh), or iridium (Jr), or a multilayered metal film of at least two of them.

The acoustic mirror 30 is located so as to include the resonance region 50 in plan view. The acoustic mirror 30 is not located in at least a part of a region 54 between the resonance regions 50. The insulating film 20 is located in the region where no acoustic mirror 30 is located. The acoustic wave excited in the resonance region 50 of the piezoelectric substrate 14 is reflected by the acoustic mirror 30. Accordingly, the acoustic wave is confined in the piezoelectric substrate 14. Since the insulating film 20 is located between the resonance regions 50, the interference between the resonance regions 50 is reduced.

As illustrated in FIG. 2, the piezoelectric thin film resonators include the series resonators S1 through S4 and the parallel resonators P1 through P3. The lower electrode 12 and/or the upper electrode 16 connects between the resonance regions 50 of the piezoelectric thin film resonators. A metal film such as an Au film or a Cu film for reducing the resistance may be located under the lower electrode 12 and/or on the upper electrode 16 in regions other than the resonance regions 50. The input terminal Tin, the output terminal Tout, and ground terminals Tgnd connecting to the parallel resonators P1 through P3 include the upper electrode 16.

As illustrated in FIG. 2 and FIG. 3B, in a region 52 other than the resonance region 50 and the region 54, the acoustic mirror 30 and the lower electrode 12 may support the piezoelectric substrate 14. The acoustic mirror 30 may not be necessarily located in all the regions other than the resonance regions 50 and the region 54.

As illustrated in FIG. 2 and FIG. 3C, when the lower electrode 12 and the upper electrode 16 are electrically connected, a through hole is formed in the piezoelectric substrate 14. A through electrode 18 is located in the through hole. The through electrode 18 electrically connects the lower electrode 12 and the upper electrode 16. The input terminal Tin, the output terminal Tout, and the ground terminals Tgnd are external connection terminals for electrically connecting to an external element. A bump or a bonding wire is in contact with the external connection terminal from above. Thus, the external connection terminal is formed on the upper surface of the piezoelectric substrate 14. When the lower electrode 12 is coupled to the external connection terminal, the lower electrode 12 and the upper electrode 16 are electrically connected with use of the through electrode 18. The through electrode 18 is formed of, for example, a metal layer such as an Au layer or a Cu layer.

Fabrication Method of the First Embodiment

Figure 4A:
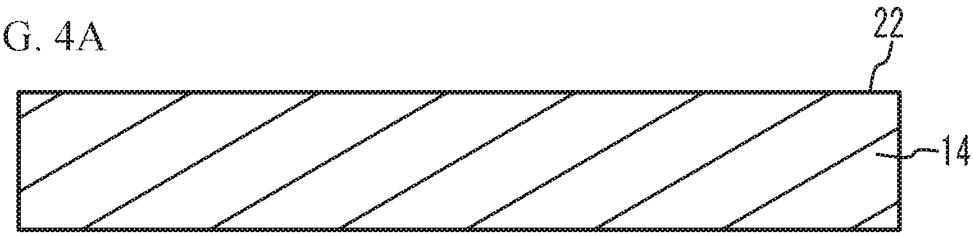
FIG. 4A through FIG. 4D are cross-sectional views (No. 1) illustrating a method of fabricating the acoustic wave device of the first embodiment.
Figure 4B:
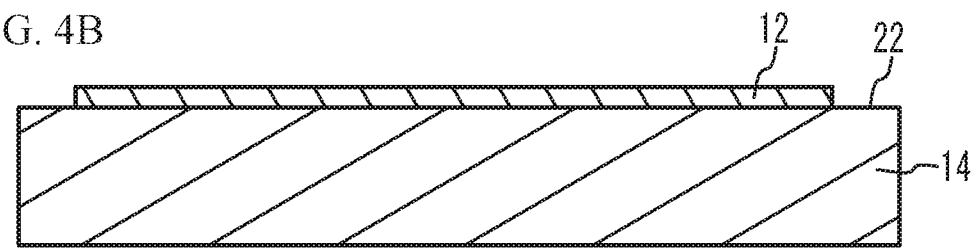

FIG. 4A through FIG. 6B are cross-sectional views illustrating a method of fabricating the acoustic wave device of the first embodiment. As illustrated in FIG. 4A, the single-crystal piezoelectric substrate 14 in a wafer state is prepared. The piezoelectric substrate 14 has a film thickness of, for example, hundreds of micrometers, and is fabricated by the Czochralski method or the like. In FIG. 4A through FIG. 4D, the lower surface 22 of the piezoelectric substrate 14 is at the upper side. As illustrated in FIG. 4B, the lower electrode 12 is formed on the lower surface 22 of the piezoelectric substrate 14. The lower electrode 12 having a desired shape is formed by, for example, sputtering or vacuum evaporation, and etching or liftoff.

Figure 4C:
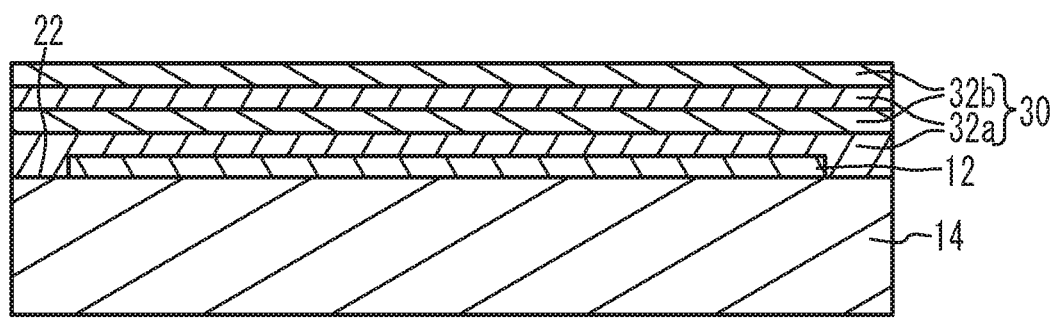
Figure 4D:
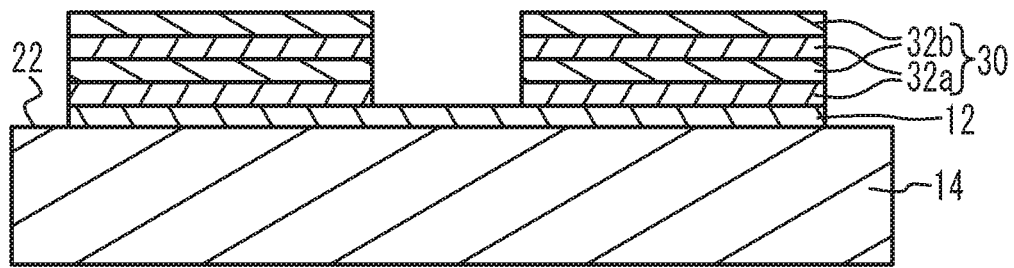

As illustrated in FIG. 4C, the acoustic mirror 30 is formed on the piezoelectric substrate 14 so as to cover the lower electrode 12. The first films 32a and the second films 32b are alternately formed as the acoustic mirror 30. The first film 32a and the second film 32b are formed by, for example, sputtering, vacuum evaporation, or Chemical Vapor Deposition (CVD). As illustrated in FIG. 4D, the acoustic mirror 30 is patterned into a desired shape by removing a part of the acoustic mirror 30 by, for example, etching.

Figure 5A:
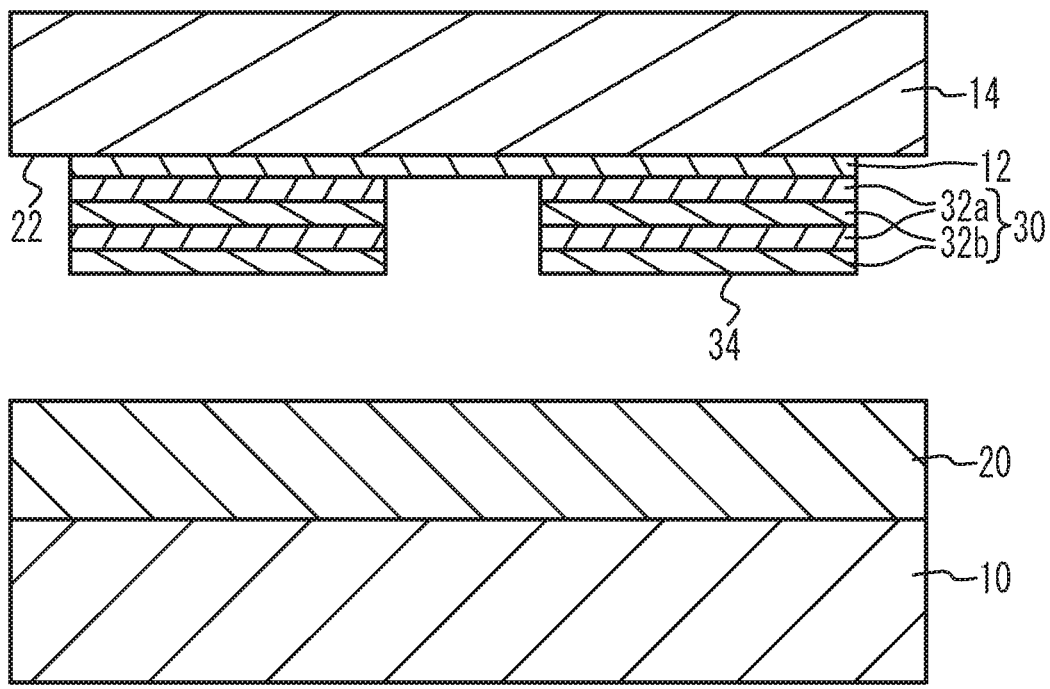
FIG. 5A and FIG. 5B are cross-sectional views (No. 2) illustrating the method of fabricating the acoustic wave device of the first embodiment.
Figure 5B:
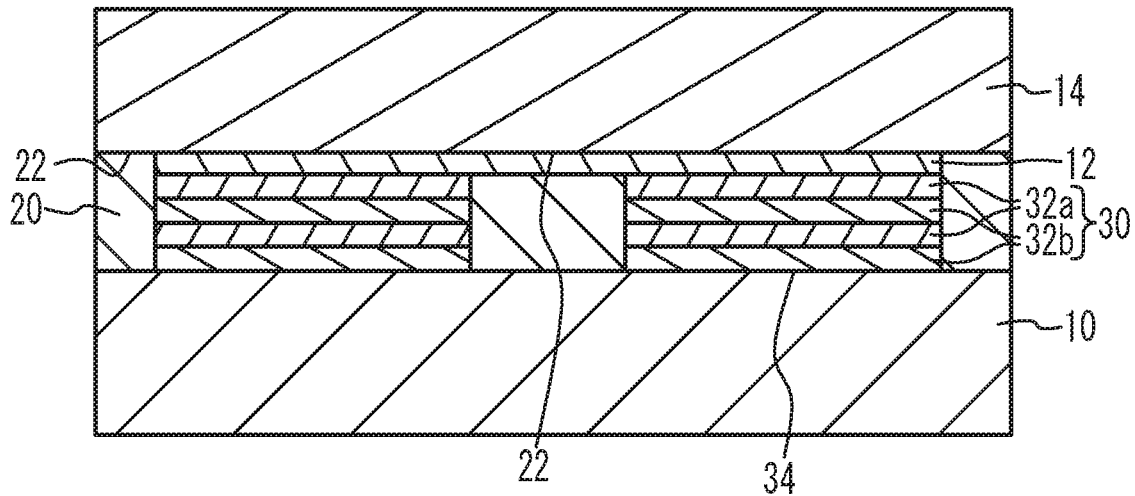

As illustrated in FIG. 5A, the insulating film 20 is formed on the support substrate 10. The insulating film 20 is formed by, for example, applying resin or attaching a sheet. The piezoelectric substrate 14 is arranged above the support substrate 10 so that an opposite surface 34 of the acoustic mirror 30 from the piezoelectric substrate 14 faces the support substrate 10. At this time, the piezoelectric substrate 14 and the support substrate 10 are in a wafer state. As illustrated in FIG. 5B, the surface 34 of the acoustic mirror 30 is attached to the surface of the support substrate 10. As an example, when a thermoset resin is used as the insulating film 20, a resin layer before thermally cured is formed on the support substrate 10. Then, the acoustic mirror 30 is attached to the support substrate 10 while deforming the resin layer. Thereafter, the resin layer is hardened by heating, and the insulating film 20 is thereby formed. The insulating film 20 may remain between the support substrate 10 and the acoustic mirror 30 to function as an adhesive agent that bonds the support substrate 10 and the acoustic mirror 30. As another example, an aperture having the size substantially identical to the size of the acoustic mirror 30 is formed in the insulating film 20. Then, the acoustic mirror 30 is embedded in the aperture. The acoustic mirror 30 and the support substrate 10 may be indirectly bonded through an adhesive agent, or may be directly bonded.

Figure 6A:
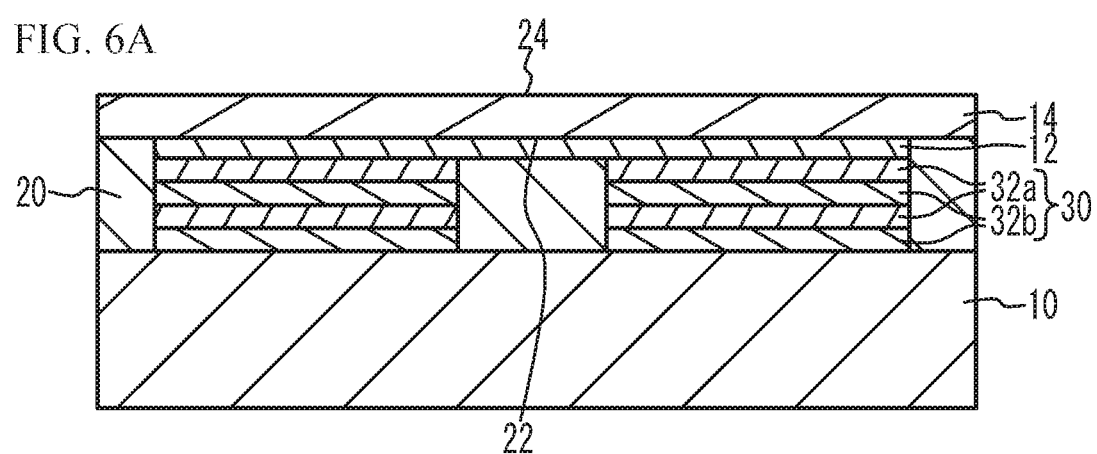
FIG. 6A and FIG. 6B are cross-sectional views (No. 3) illustrating the method of fabricating the acoustic wave device of the first embodiment.
Figure 6B:
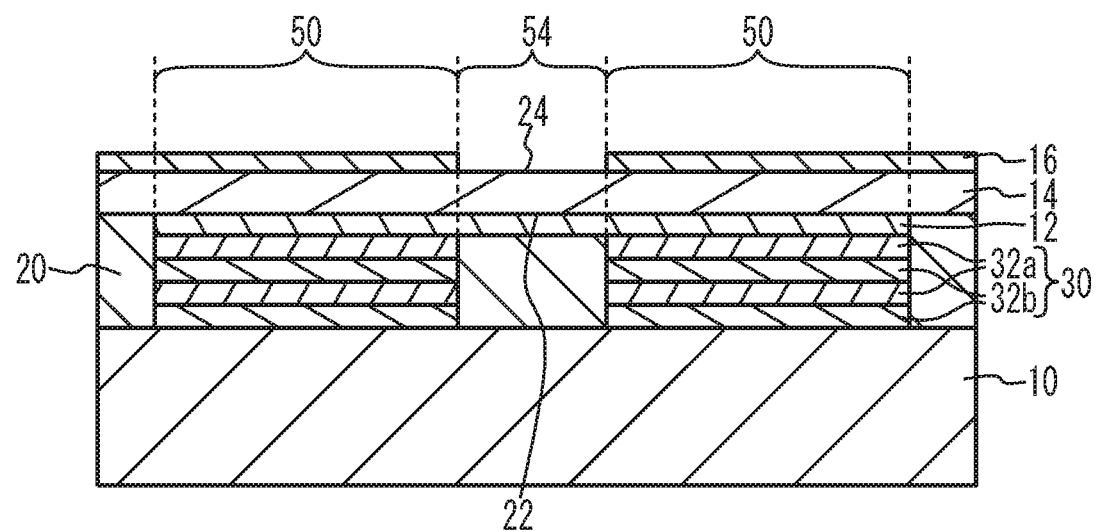

As illustrated in FIG. 6A, the upper surface of the piezoelectric substrate 14 is polished by, for example, Chemical Mechanical Polishing (CMP). This process makes the piezoelectric substrate 14 have a desired thickness (for example, from 1 µm to 10 µm). As illustrated in FIG. 6B, the upper electrode 16 is formed on the upper surface 24 of the piezoelectric substrate 14. The upper electrode 16 having a desired shape is formed by, for example, sputtering or vacuum evaporation, and etching or liftoff. Thereafter, the support substrate 10, the insulating film 20, and the piezoelectric substrate 14 are cut by dicing or the like. The above-described processes complete the acoustic wave device of the first embodiment.

A polycrystalline aluminum nitride (AlN) film or a polycrystalline zinc oxide (ZnO) film is used as the piezoelectric film of the piezoelectric thin film resonator. When the aluminum nitride film is used in the piezoelectric thin film resonator, the electromechanical coupling coefficient is from 6% to 7%, and the temperature coefficient of frequency (TCF) such as the temperature coefficient of the resonant frequency is −30 ppm/° C. When zinc oxide is used in the piezoelectric thin film resonator, the electromechanical coupling coefficient is 8.5%, but the TCF is −60 ppm/T.

In the first embodiment, the piezoelectric substrate 14 that is single-crystal is used in the piezoelectric thin film resonator. For example, when an X-cut single-crystal lithium tantalate substrate or an X-cut single-crystal lithium niobate substrate is used, the electromechanical coupling coefficient is 18%, and the TCF of the resonant frequency is several ppm/° C. As described above, the use of the single-crystal piezoelectric substrate 14 improves the characteristics such as the electromechanical coupling coefficient and the TCF. However, when the piezoelectric layer is formed on the support substrate 10, the piezoelectric layer is not formed as a single-crystal layer. Thus, as illustrated in FIG. 5B, the single-crystal piezoelectric substrate 14 is located on the support substrate 10 by bonding the piezoelectric substrate 14 in a wafer state on the support substrate 10 in a wafer state.

Hereinafter, first and second comparative examples referring to the second embodiment of Patent Application Publication No. 2012-165132 using a method of bonding the piezoelectric substrate 14 to the support substrate 10 will be described.

Fabrication Method of the First Comparative Example

Figure 7A:
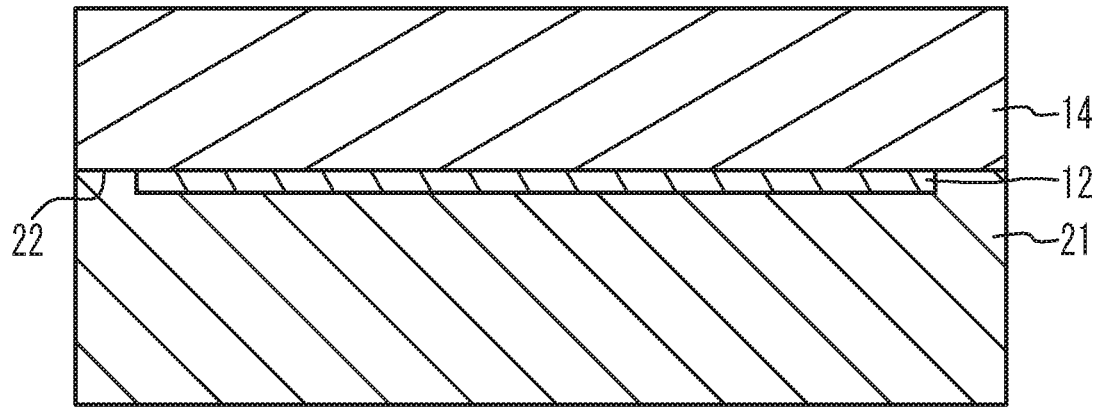
FIG. 7A through FIG. 7C are cross-sectional views (No. 1) illustrating a method of fabricating an acoustic wave device in accordance with a first comparative example.
Figure 7B:
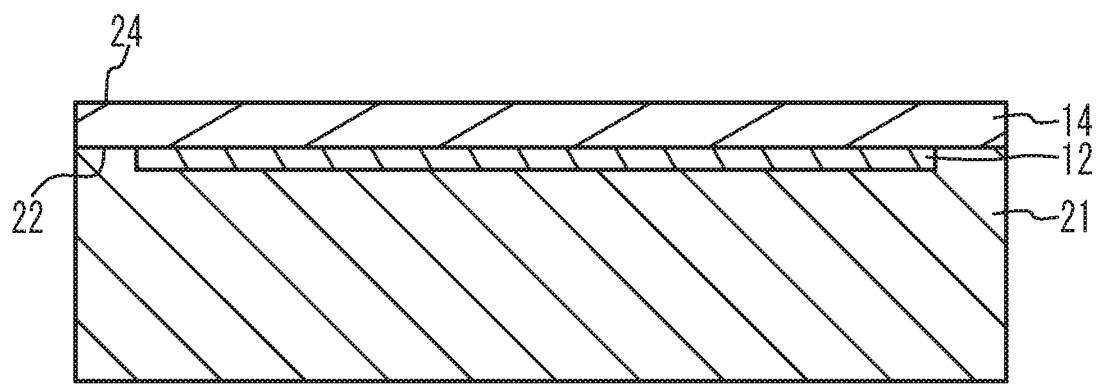
Figure 7C:
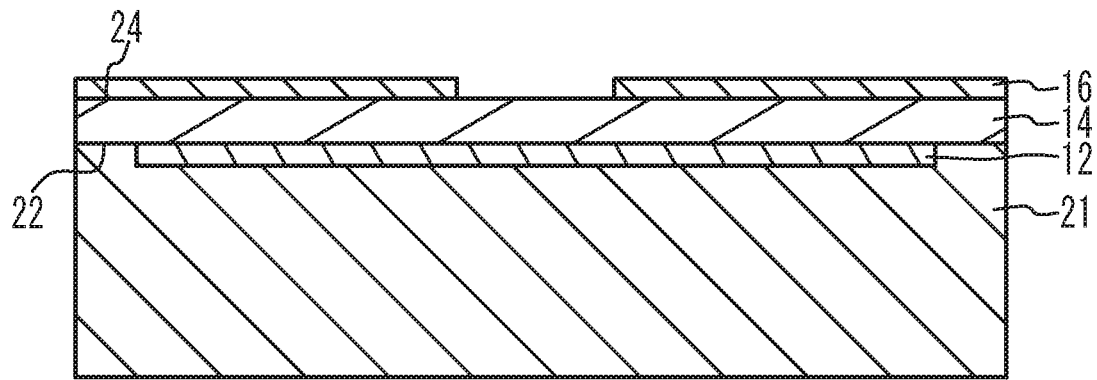

FIG. 7A through FIG. 8C are cross-sectional views illustrating a method of fabricating an acoustic wave device in accordance with the first comparative example. As illustrated in FIG. 7A, the lower electrode 12 having a desired shape is formed on the lower surface 22 of the piezoelectric substrate 14 that is single-crystal. The lower surface 22 of the piezoelectric substrate 14 is bonded to the upper surface of a support layer 21. As illustrated in FIG. 7B, the upper surface of the piezoelectric substrate 14 is polished to thin the piezoelectric substrate 14. As illustrated in FIG. 7C, the upper electrode 16 is formed on the upper surface 24 of the piezoelectric substrate 14.

Figure 8A:
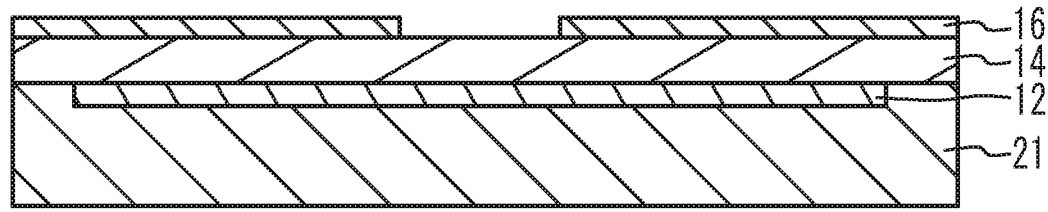
FIG. 8A through FIG. 8C are cross-sectional views (No. 2) illustrating the method of fabricating the acoustic wave device in accordance with the first comparative example.
Figure 8B:
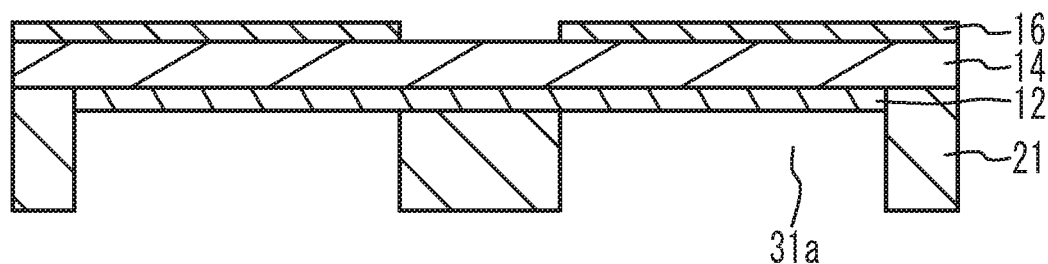
Figure 8C:
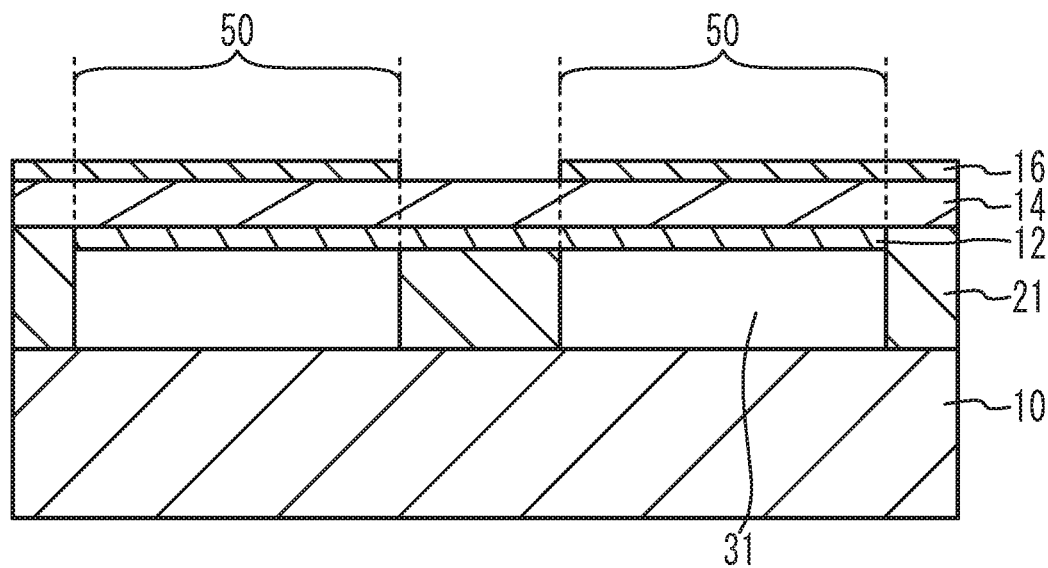

As illustrated in FIG. 8A, the lower surface of the support layer 21 is polished to thin the support layer 21. As illustrated in FIG. 8B, holes 31a penetrating through the support layer 21 are formed. As illustrated in FIG. 8C, the upper surface of the support substrate 10 is bonded to the lower surface of the support layer 21. This process forms an air gap 31 from the hole 31a so that the air gap 31 includes the resonance region 50 in plan view.

In the first comparative example, when the hole 31a is formed in the support layer 21 in FIG. 8B, damage or the like tends to be introduced into the lower electrode 12 and/or the piezoelectric substrate 14 in the resonance region 50. Additionally, in FIG. 8C, when the support layer 21 is bonded to the support substrate 10, the air gap 31 is located between the piezoelectric substrate and the support substrate 10 in the resonance region 50. Thus, due to shock or stress when the support layer 21 is bonded to the support substrate 10, distortion tends to occur in the piezoelectric substrate 14 in the resonance region 50. In addition, during the steps from FIG. 8A through FIG. 8C, the wafer is handled with the piezoelectric substrate 14 and the support layer 21 being thin. Thus, distortion tends to be introduced into the piezoelectric substrate 14 and/or the piezoelectric substrate 14 tends to be damaged.

Fabrication Method of the Second Comparative Example

Figure 9A:
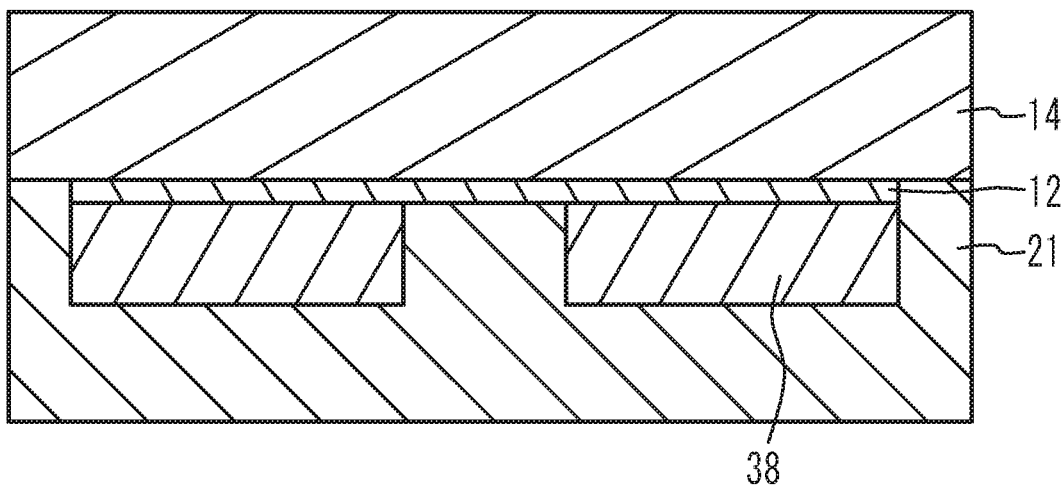
FIG. 9A through FIG. 9C are cross-sectional views (No. 1) illustrating a method of fabricating an acoustic wave device in accordance with a second comparative example.
Figure 9B:
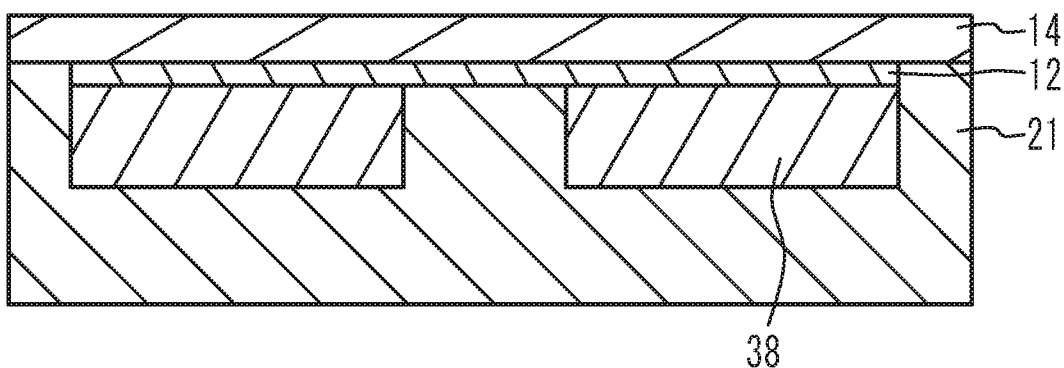
Figure 9C:
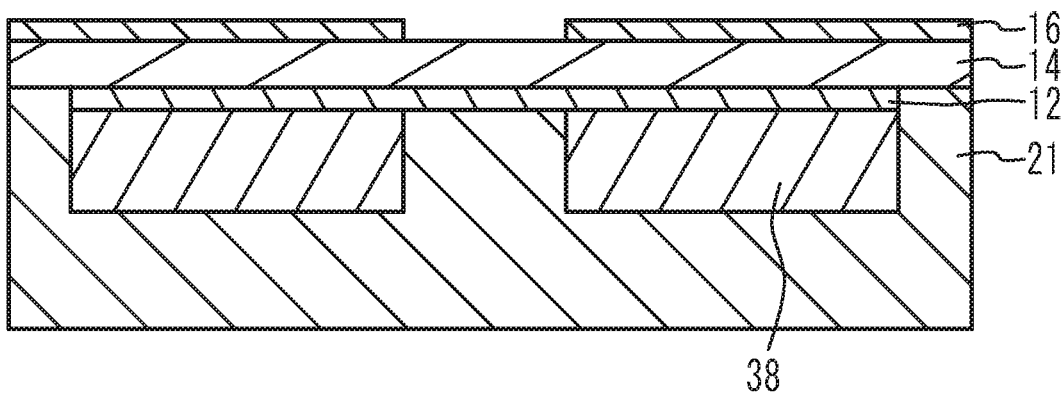

FIG. 9A through FIG. 10C are cross-sectional views illustrating a method of fabricating an acoustic wave device in accordance with the second comparative example. As illustrated in FIG. 9A, a sacrifice layer 38 is embedded in a recessed portion on the upper surface of the support layer 21. The piezoelectric substrate 14 having the lower electrode 12 formed thereon is bonded to the upper surface of the support layer 21. As illustrated in FIG. 9B, the piezoelectric substrate 14 is thinned. As illustrated in FIG. 9C, the upper electrode 16 is formed on the upper surface 24 of the piezoelectric substrate 14.

Figure 10A:
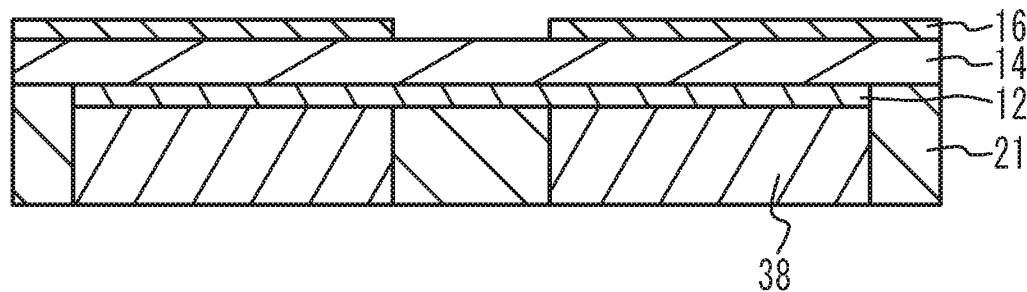
FIG. 10A through FIG. 10C are cross-sectional views (No. 2) illustrating the method of fabricating an acoustic wave device in accordance with the second comparative example.
Figure 10B:
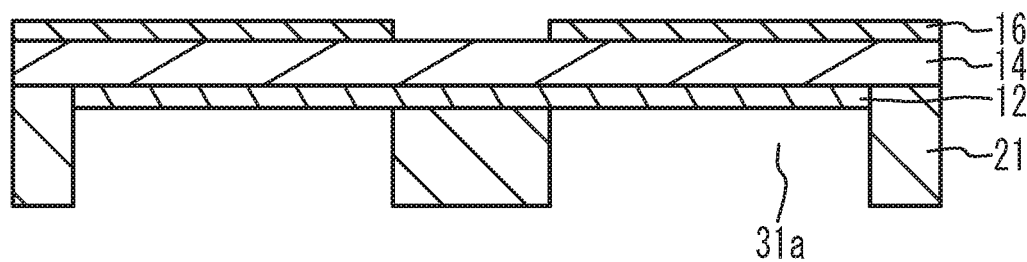
Figure 10C:
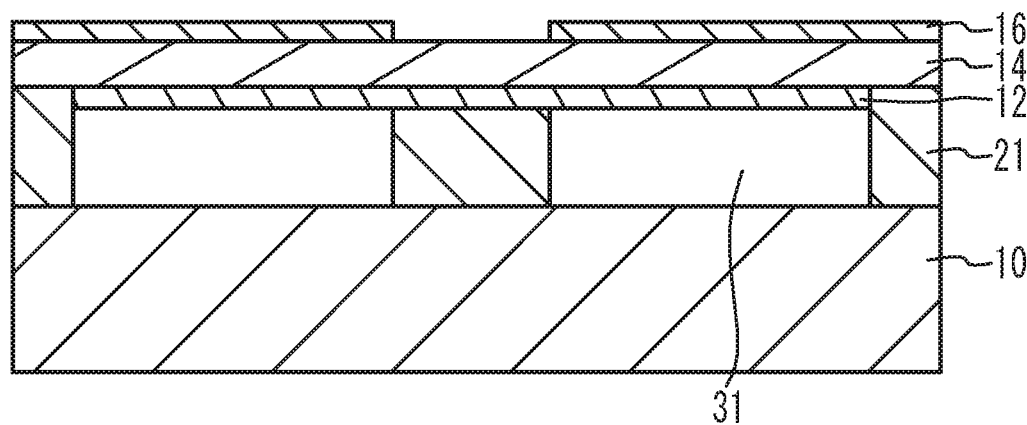

As illustrated in FIG. 10A, the support layer 21 is thinned. As illustrated in FIG. 10B, the sacrifice layer 38 is removed. This process forms the hole 31a penetrating through the support layer 21. As illustrated in FIG. 10C, the upper surface of the support substrate 10 is bonded to the lower surface of the support layer 21.

In the second comparative example, damage tends to be introduced into the lower electrode 12 and/or the piezoelectric substrate 14 in the resonance region 50 when the sacrifice layer 38 is removed as illustrated in FIG. 10B. In addition, as in the first comparative example, when the support layer 21 is bonded to the support substrate 10 in FIG. 10C, distortion tends to occur in the piezoelectric substrate 14 in the resonance region 50. Furthermore, during the steps from FIG. 10A through FIG. 10C, since the piezoelectric substrate 14 and the support layer 21 are thin, distortion tends to be introduced into the piezoelectric substrate 14 and/or the piezoelectric substrate 14 tends to be damaged.

Fabrication Method of the Third Comparative Example

Figure 11A:
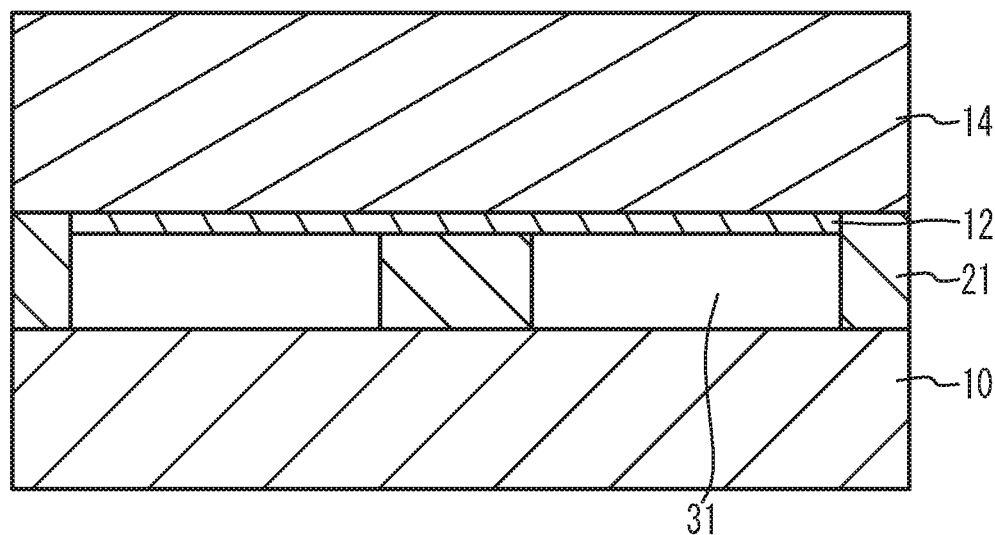
FIG. 11A through FIG. 11C are cross-sectional views illustrating a method of fabricating an acoustic wave device in accordance with a third comparative example.
Figure 11B:
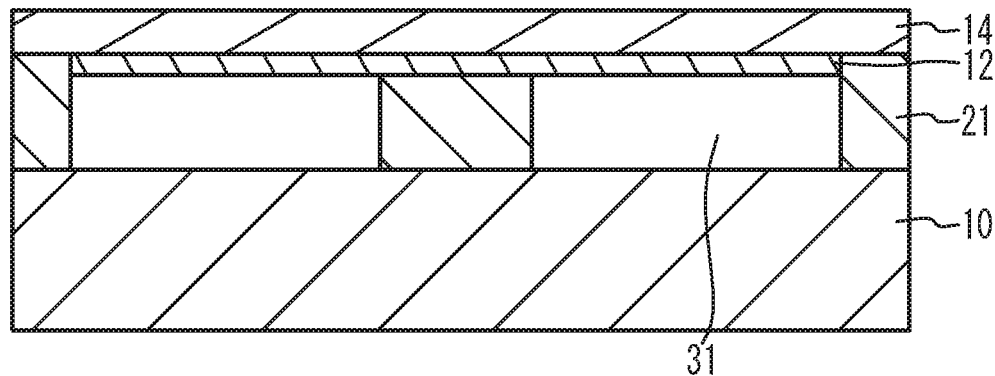
Figure 11C:
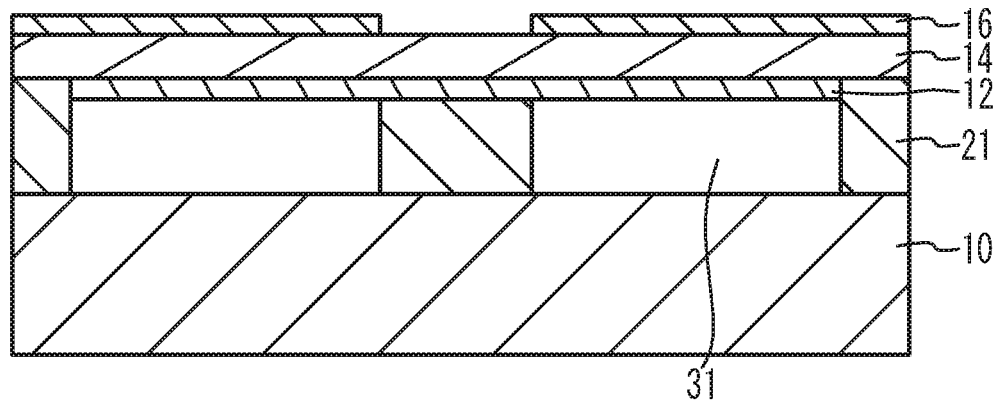

FIG. 11A through FIG. 11C are cross-sectional views illustrating a method of fabricating an acoustic wave device in accordance with a third comparative example. As illustrated in FIG. 11A, before the piezoelectric substrate 14 is thinned and the upper electrode 16 is formed, the support layer 21 is thinned and the air gap 31 is formed. Then, the support layer 21 is bonded to the support substrate 10. As illustrated in FIG. 11B, the piezoelectric substrate 14 is thinned. As illustrated in FIG. 11C, the upper electrode 16 is formed on the upper surface of the piezoelectric substrate 14.

In the third comparative example, the support layer 21 is bonded to the support substrate 10 with the piezoelectric substrate 14 being thick. Thus, unlike the first and second comparative examples, the wafer is not handled while the piezoelectric substrate 14 and the support layer 21 are thin. Thus, distortion and/or breakage of the piezoelectric substrate 14 is inhibited. However, since the piezoelectric substrate 14 is thinned while the air gap 31 exists as illustrated in FIG. 11B, distortion may be introduced into the piezoelectric substrate 14 in the resonance region 50 and/or the piezoelectric substrate 14 may be damaged.

In addition, as in the first and second comparative examples, since the air gap 31 is formed in the support layer 21 in the resonance region, damage tends to be introduced into the lower electrode 12 and/or the piezoelectric substrate 14 in the resonance region 50. Furthermore, the support layer 21 is bonded to the support substrate 10 while the air gap 31 is located in the support layer 21 in the resonance region 50. Thus, distortion tends to be introduced into the piezoelectric substrate 14 in the resonance region 50 due to the shock at the time of bonding.

Advantage of the First Embodiment

In the acoustic wave device of the first embodiment, as illustrated in FIG. 2 through FIG. 3C, the lower electrodes 12 (first electrodes) are located on the lower surface 22 (a first surface) of the single piezoelectric substrate 14 that is single-crystal, and the upper electrodes 16 (second electrodes) are located on the upper surface 24 (a second surface) of the piezoelectric substrate 14. The acoustic mirror 30 is bonded on the support substrate 10, is located between the support substrate 10 and the lower electrodes 12 in the resonance regions 50, and is not located between the support substrate 10 and the lower electrodes 12 in at least a part of the region 54 between the resonance regions 50.

As a method of fabricating the acoustic wave device, as illustrated in FIG. 4C, the acoustic mirror 30 is formed on the lower surface 22 so as to cover the lower electrodes 12. As illustrated in FIG. 4D, the acoustic mirror 30 is left in the regions to be the resonance regions 50, and the acoustic mirror 30 in at least a part of the region between the regions to be the resonance regions is removed. As illustrated in FIG. 5B, thereafter, the acoustic mirror 30 is bonded to the support substrate 10.

Compared to the first through third comparative examples, the fabrication process does not become complicating because the air gap 31 is not formed in the resonance region 50. Thus, damage is inhibited from being introduced into the lower electrode 12 and/or the piezoelectric substrate 14 in the resonance region 50. As illustrated in FIG. 5B, the acoustic mirror 30 is bonded to the support substrate 10 with the acoustic mirror 30 being formed in the resonance region 50. Thus, distortion is inhibited from being introduced into the piezoelectric substrate 14 in the resonance region 50 because of the shock at the time of bonding.

Additionally, as illustrated in FIG. 3B, the insulating film 20 made of a material different from that of the acoustic mirror 30 is located between the support substrate 10 and the piezoelectric substrate 14 in at least a part of the region 54 between the resonance regions 50. This structure protects the piezoelectric substrate 14. Thus, introduction of distortion into the piezoelectric substrate 14 and/or damage to the piezoelectric substrate 14 is further inhibited.

The insulating film 20 preferably has less acoustic impedance than the first film 32a and the second film 32b of the acoustic mirror 30. This configuration attenuates the acoustic wave in the insulating film 20. Thus, the interference of the acoustic wave between the resonance regions 50 is inhibited. In addition, the insulating film 20 preferably has a less relative permittivity than the first film 32a and the second film 32b of the acoustic mirror 30. This configuration reduces the electric connection between the resonance regions 50. The use of a resin layer for the insulating film 20 enables to fabricate the acoustic wave device inexpensively.

Furthermore, the piezoelectric substrate 14 is a lithium tantalate substrate or a lithium niobate substrate. This configuration improves the electromechanical coupling coefficient and the TCF.

In the first embodiment, the acoustic mirror 30 is located between the piezoelectric substrate 14 and the support substrate 10. Thus, as illustrated in FIG. 6A, even when the piezoelectric substrate 14 is thinned after the acoustic mirror 30 is bonded to the support substrate 10, introduction of distortion into the piezoelectric substrate 14 and breakage of the piezoelectric substrate 14 described in the third comparative example is inhibited. As illustrated in FIG. 6B, after the piezoelectric substrate 14 is thinned, the upper electrode 16 is formed on the upper surface 24 of the piezoelectric substrate 14. Accordingly, unlike the first and second comparative examples, it is not necessary to execute a process while the piezoelectric substrate 14 and the support layer 21 are thin. Thus, distortion and/or breakage of the piezoelectric substrate 14 is inhibited.

The lower electrode 12 and/or the upper electrode 16 electrically connects between the piezoelectric thin film resonators corresponding to the resonance regions 50. This structure enables to connect between the piezoelectric thin film resonators. The piezoelectric thin film resonators include one or more series resonators S1 through S4 and one or more parallel resonators P1 through P3. Accordingly, the ladder-type filter can be formed.

First Variation of the First Embodiment

Figure 12A:
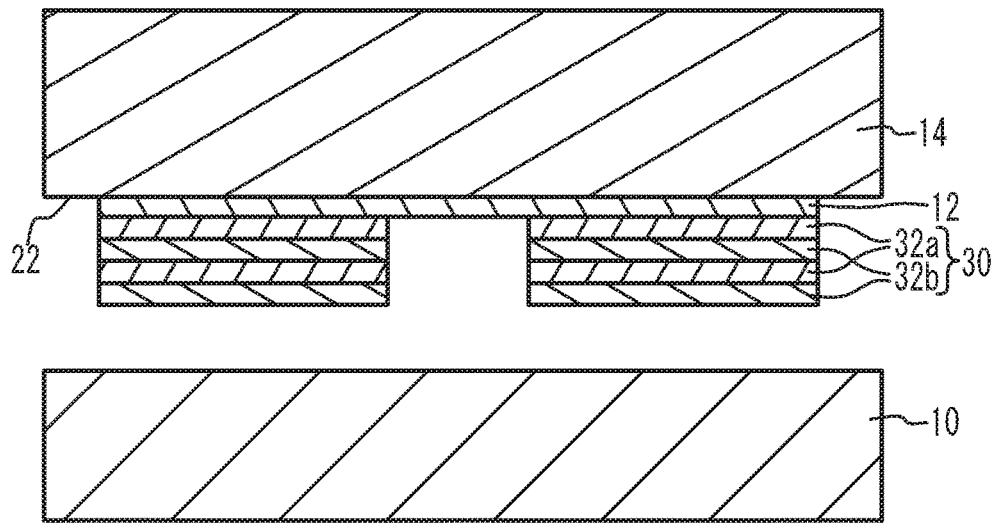
FIG. 12A through FIG. 12C are cross-sectional views illustrating a method of fabricating an acoustic wave device in accordance with a first variation of the first embodiment.
Figure 12B:
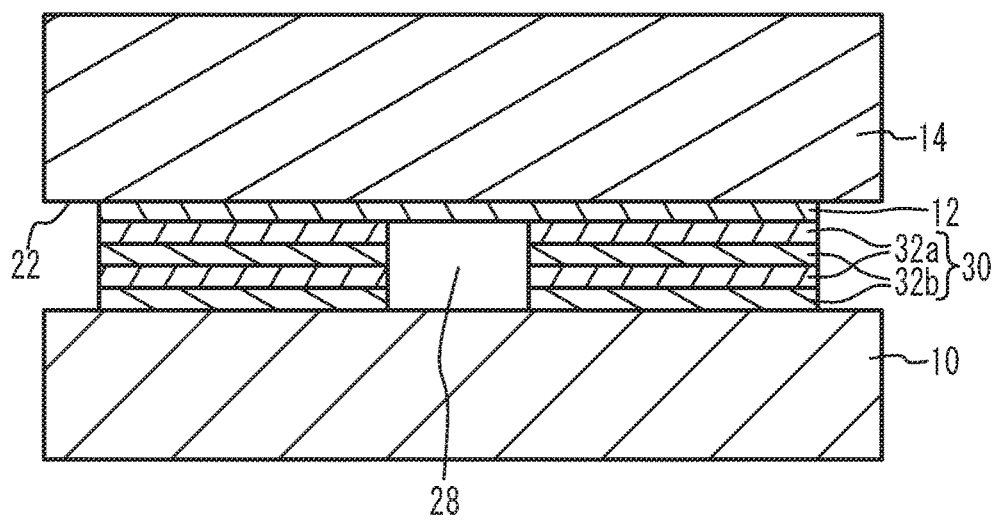
Figure 12C:
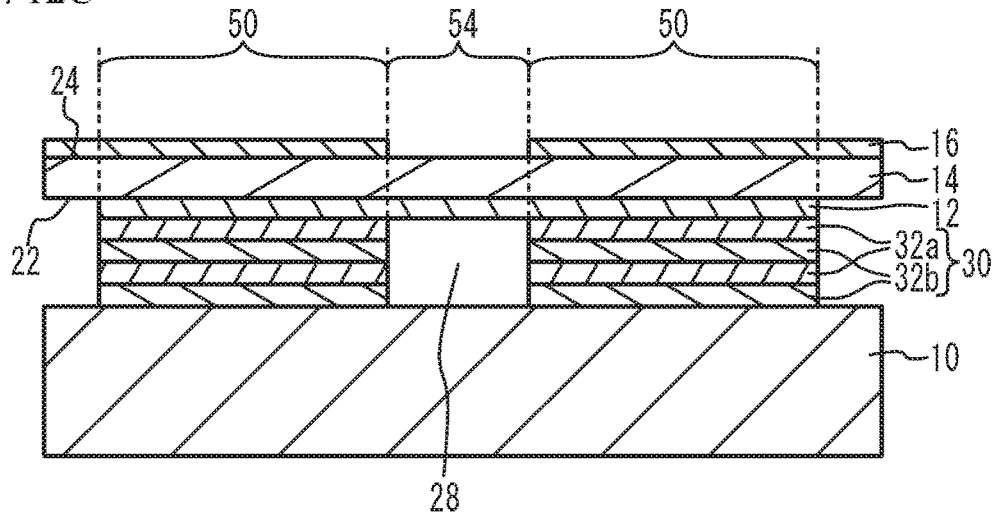

FIG. 12A through FIG. 12C are cross-sectional views illustrating a method of fabricating an acoustic wave device in accordance with a first variation of the first embodiment. As illustrated in FIG. 12A, the same steps as the steps from FIG. 4A to FIG. 4D of the first embodiment are executed. No insulating film is located on the upper surface of the support substrate 10. As illustrated in FIG. 12B, the acoustic mirror 30 is bonded to the support substrate 10. As illustrated in FIG. 12C, the steps of FIG. 6A and FIG. 6B of the first embodiment are executed. This process forms an air gap 28 between the support substrate 10 and the piezoelectric substrate 14 in at least a part of the region 54 between the resonance regions 50. Thus, interference of the acoustic wave between the resonance regions 50 and/or the electrical connection between the resonance regions 50 is inhibited.

Second Variation of the First Embodiment

Figure 13A:
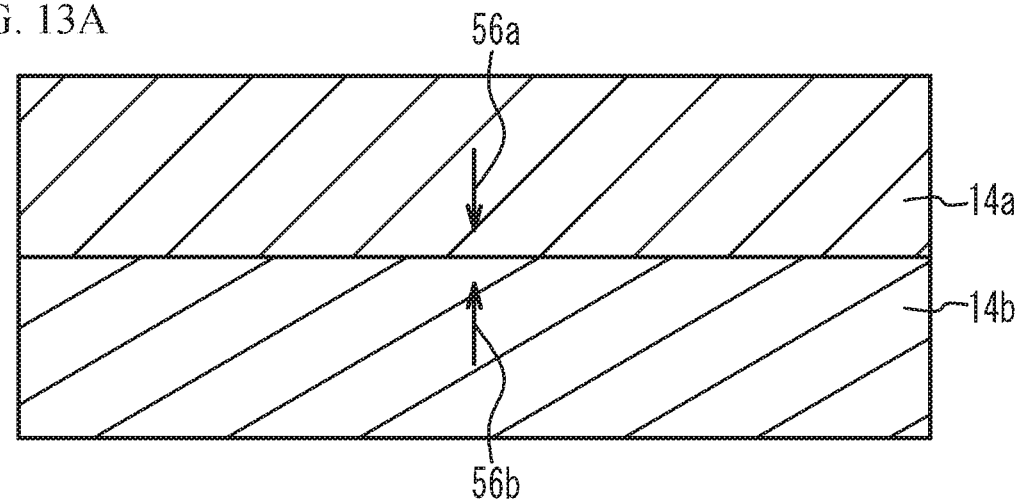
FIG. 13A through FIG. 13C are cross-sectional views (No. 1) illustrating a method of fabricating an acoustic wave device in accordance with a second variation of the first embodiment.

FIG. 13A through FIG. 14B are cross-sectional views illustrating a method of fabricating an acoustic wave device in accordance with a second variation of the first embodiment. As illustrated in FIG. 13A, piezoelectric substrates 14a and 14b are bonded. The piezoelectric substrates 14a and 14b are bonded by, for example, surface activation under normal temperature. A polarization direction 56a of the piezoelectric substrate 14a is opposite to a polarization direction 56b of the piezoelectric substrate 14b. For example, when the piezoelectric substrates 14a and 14b are X-cut lithium tantalate substrates or X-cut lithium niobate substrates, the X-axis orientations of the piezoelectric substrates 14a and 14b are made to be opposite to each other. In FIG. 13A, the polarization directions 56a and 56b are directions facing each other, but the polarization directions 56a and 56b may be directions away from each other. The polarization direction 56a may correspond to the planar direction of the piezoelectric substrate 14a, and the polarization direction 56b may correspond to the planar direction of the piezoelectric substrate 14b and be opposite to the polarization direction 56a.

Figure 13B:
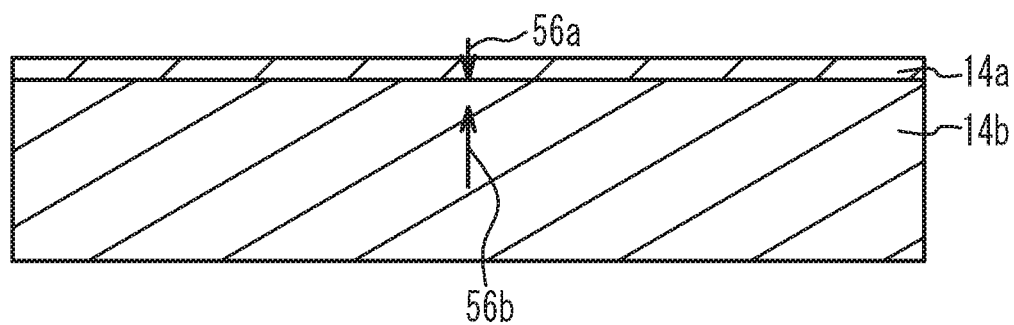
Figure 13C:
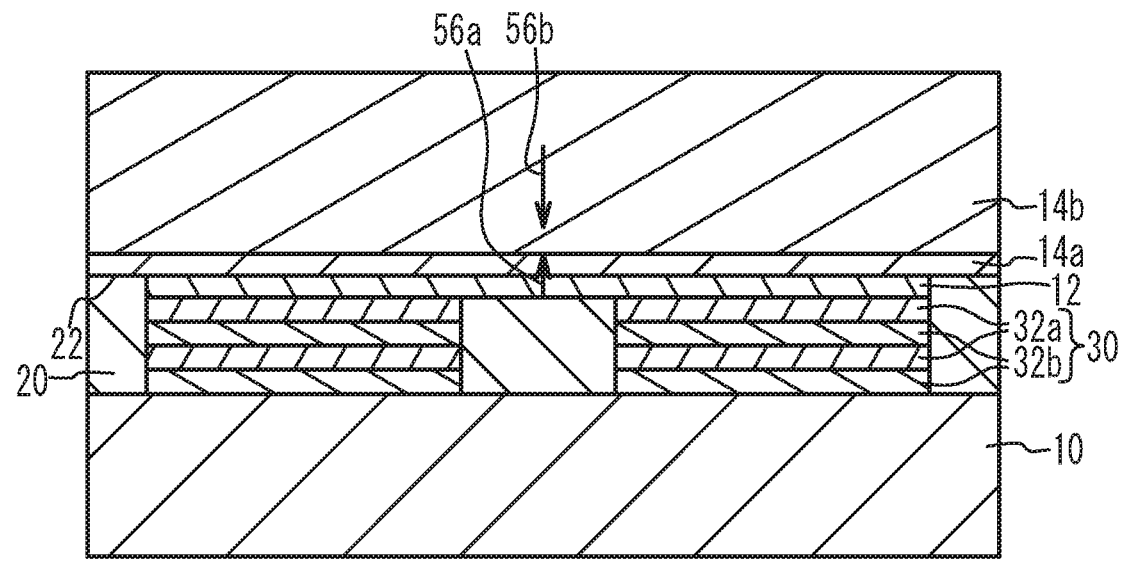
Figure 14A:
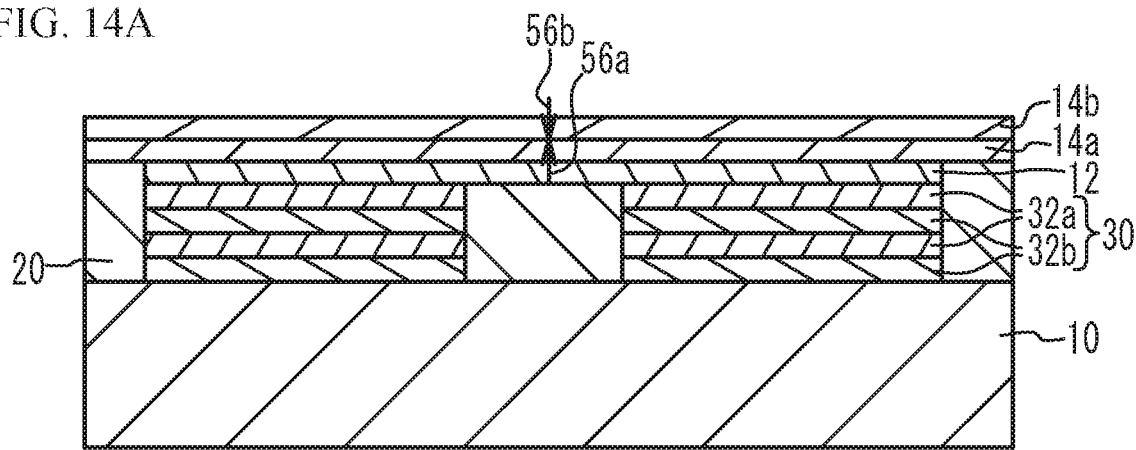
FIG. 14A and FIG. 14B are cross-sectional views (No. 2) illustrating the method of fabricating the acoustic wave device in accordance with the second variation of the first embodiment.
Figure 14B:
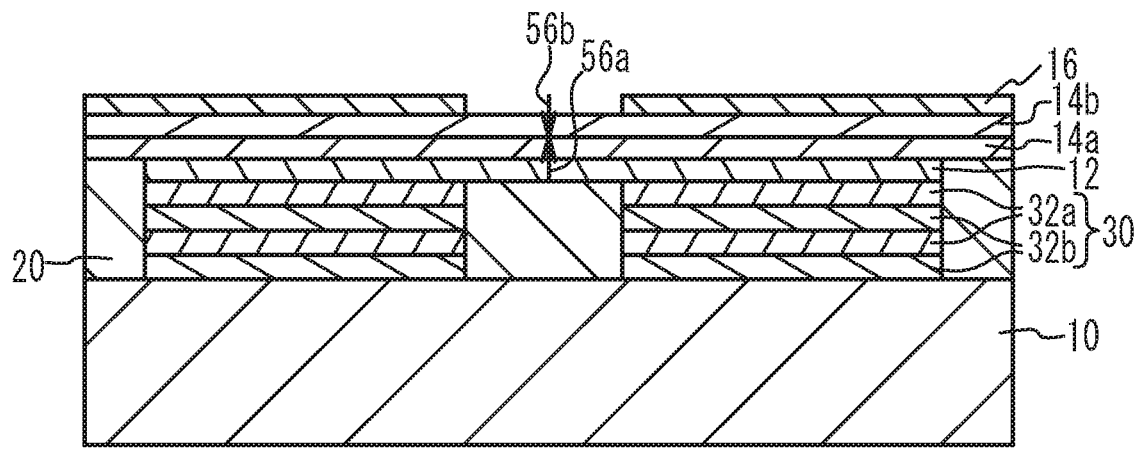

As illustrated in FIG. 13B, the piezoelectric substrate 14a is thinned. As illustrated in FIG. 13C, the same steps as the steps from FIG. 4B to FIG. 5B of the first embodiment are executed. As illustrated in FIG. 14A, the piezoelectric substrate 14b is thinned. This process forms the piezoelectric substrate 14 from the piezoelectric substrates 14a and 14b. At this time, the film thicknesses of the piezoelectric substrates 14a and 14b are made to be approximately equal to each other to the extent of production errors. As illustrated in FIG. 14B, the upper electrode 16 is formed on the piezoelectric substrate 14.

FIG. 15A and FIG. 15B illustrate the piezoelectric substrates of the first embodiment and the second variation of the first embodiment, respectively. As illustrated in FIG. 15A, in the first embodiment, a polarization direction 56 of the piezoelectric substrate 14 is the direction from the upper electrode 16 to the lower electrode 12. The film thickness of the piezoelectric substrate 14 is represented by h. When the piezoelectric thin film resonator operates in a mode of a fundamental wave, the electric field distribution of the acoustic wave in the piezoelectric substrate 14 becomes negative (−) at the lower electrode 12 when being positive (+) at the upper electrode 16. The displacement distribution of the acoustic wave in the piezoelectric substrate 14 becomes negative (−) at the lower electrode 12 when being positive (+) at the upper electrode 16, for example. Accordingly, the piezoelectric substrate 14 elongates (or contracts) as indicated by an arrow 57a. Thus, the wavelength λ of the acoustic wave becomes 2 h. The operation frequency becomes the acoustic velocity/the film thickness h.

As illustrated in FIG. 15B, in the second variation of the first embodiment, provided as the piezoelectric substrate 14 are the piezoelectric substrate 14a (a first substrate) and the piezoelectric substrate 14b (a second substrate) that have the same film thickness, are made of the same material, have opposite polarization directions, and are stacked. The piezoelectric substrate 14a and the piezoelectric substrate 14b have the same film thickness, and the piezoelectric substrate 14 has a film thickness of h'. When it is assumed that h'=h, the electric field distribution of the acoustic wave in the piezoelectric substrate 14 becomes negative (−) at the lower electrode 12 when being positive (+) at the upper electrode 16 as in FIG. 15A. Since the polarization directions 56a and 56b of the piezoelectric substrates 14a and 14b are opposite to each other, the displacement distribution of the acoustic wave in the piezoelectric substrate 14a becomes negative (−) at the upper electrode 16 side and positive (+) at the lower electrode 12, for example, and the displacement distribution of the acoustic wave in the piezoelectric substrate 14b becomes positive (+) at the upper electrode 16 and negative (−) at the lower electrode 12 side, for example. Accordingly, the piezoelectric substrate 14a contracts (or elongates) as indicated by an arrow 57b, and the piezoelectric substrate 14b elongates (or contracts) as indicated by the arrow 57a. The operation frequency becomes the acoustic velocity/the film thickness h'/2. Thus, the second embodiment operates in a mode of second harmonic of which the operation frequency is twice that of the fundamental waves of the first embodiment and the first variation thereof.

In the second embodiment, when it is assumed that h'=2 h, the operation frequency is equal to that of the first embodiment and the first variation thereof. In both the cases of h'=h and h'=2 h, since the second-order linear distortions are canceled out each other, second harmonic distortion is reduced.

Second Embodiment

Figure 16:
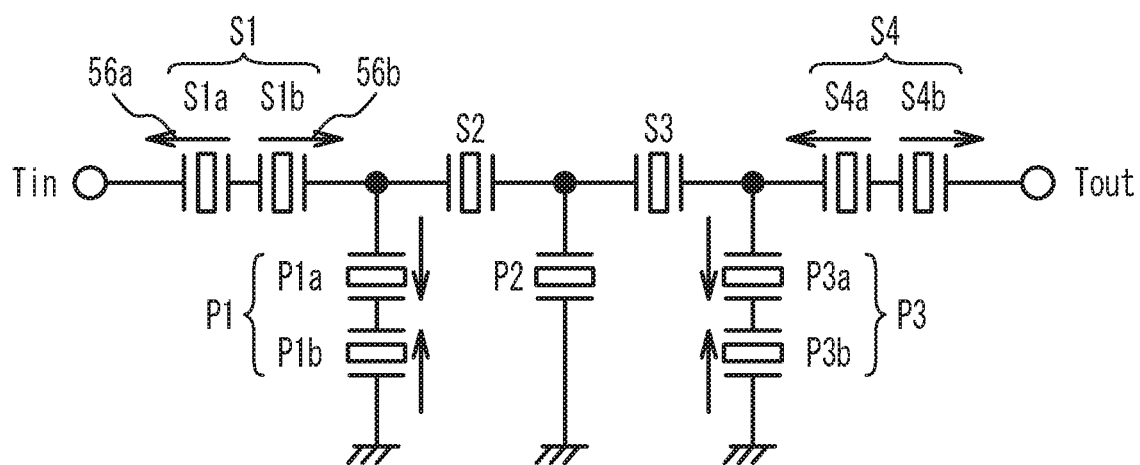
FIG. 16 is a circuit diagram of a ladder-type filter in a second embodiment.

FIG. 16 is a circuit diagram of a ladder-type filter in a second embodiment. As illustrated in FIG. 16, the series resonator S1 is divided into resonators S1a and S1b in series. The series resonator S4 is divided into resonators S4a and S4b in series. The parallel resonator P1 is divided into resonators P1a and P1b in series. The parallel resonator P3 is divided into resonators P3a and P3b in series. Other structures are the same as those of the first embodiment illustrated in FIG. 1, and the description thereof is thus omitted.

Figure 17:
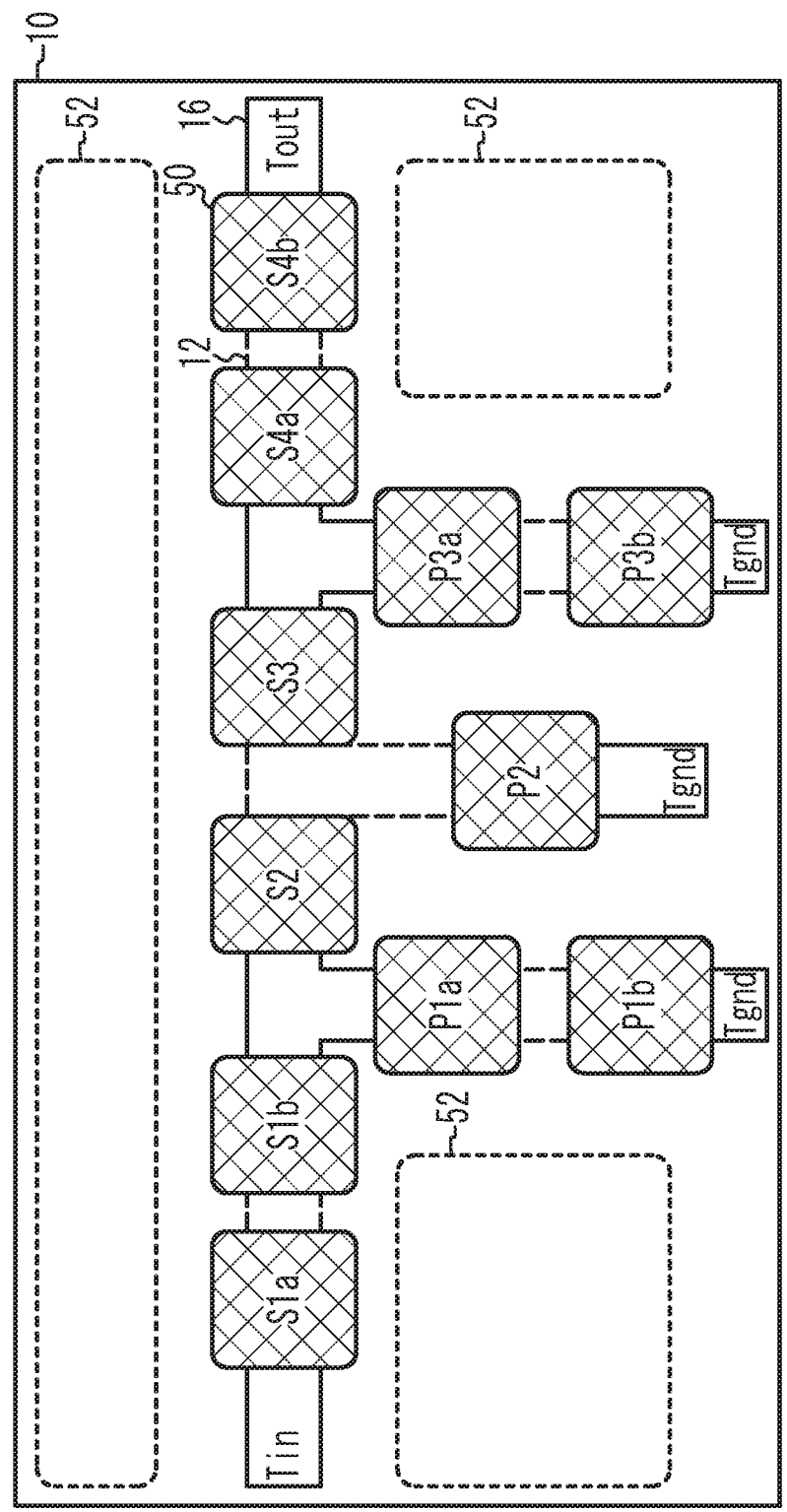
FIG. 17 is a plan view of an acoustic wave device in accordance with the second embodiment.

FIG. 17 is a plan view of an acoustic wave device in accordance with the second embodiment. As illustrated in FIG. 17, the resonators S1a and S1b, the resonators S4a and S4b, the resonators P1a and P1b, and the resonators P3a and P3b are connected by the lower electrodes 12. The through electrode 18 penetrating through the piezoelectric substrate 14 is not provided. Other structures are the same as those of the first embodiment illustrated in FIG. 2, and the description thereof is thus omitted.

As in the second embodiment, at least one (e.g., the series resonator S1) of the series resonators S1 through S4 and the parallel resonators P1 through P3 is divided into a first resonator (e.g., the resonator S1a) and a second resonator (e.g., the resonator S1b) in series between two nodes. As described above, in the case where the resonator is divided in series and the resonators S1a and S1b are connected by the lower electrode 12 or the upper electrode 16, when the resonator S1a and the resonator S1b are viewed from one (e.g., input terminal Tin) of the two nodes, the polarization direction 56a of the piezoelectric substrate 14 of the resonator S1a is opposite to the polarization direction 56b of the piezoelectric substrate 14 of the resonator S1b. Accordingly, second harmonic distortion is reduced.

It is difficult to form a through hole in the single-crystal piezoelectric substrate 14 such as a lithium tantalate substrate, a lithium niobate substrate, or a crystal substrate. In the first variation of the second embodiment, by appropriately selecting a resonator to be divided in series, even when the through electrode 18 penetrating through the piezoelectric substrate 14 and connecting the lower electrode 12 and the upper electrode 16 is not provided, all the input terminal Tin, the output terminal Tout, and the ground terminals Tgnd connected to one or more parallel resonators can be formed on the upper surface 24 of the piezoelectric substrate 14.

First Variation of the Second Embodiment

Figure 18:
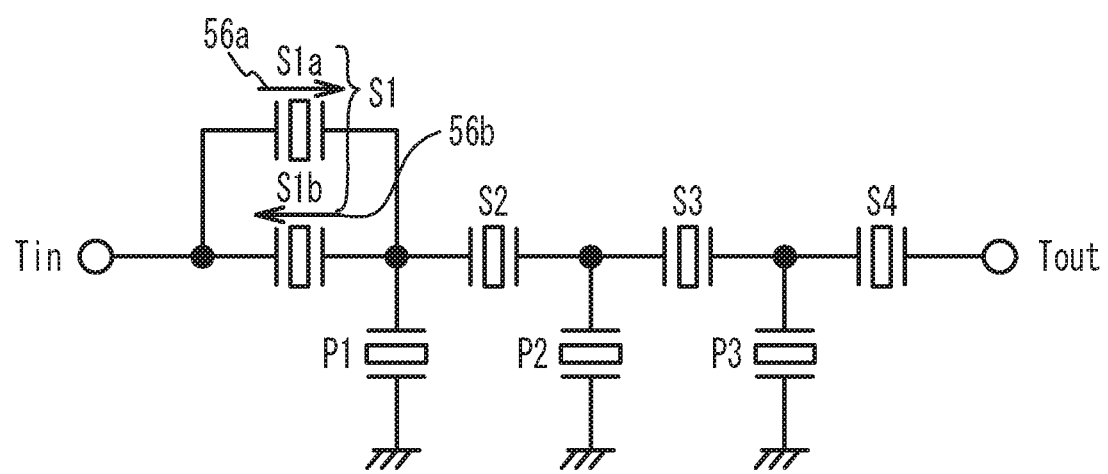
FIG. 18 is a circuit diagram of a ladder-type filter in a first variation of the second embodiment.

FIG. 18 is a circuit diagram of a ladder-type filter in a first variation of the second embodiment. As illustrated in FIG. 18, the series resonator S1 is divided into the resonators S1a and S1b in parallel. Other structures are the same as those of the first embodiment illustrated in FIG. 1, and the description thereof is thus omitted.

Figure 19:
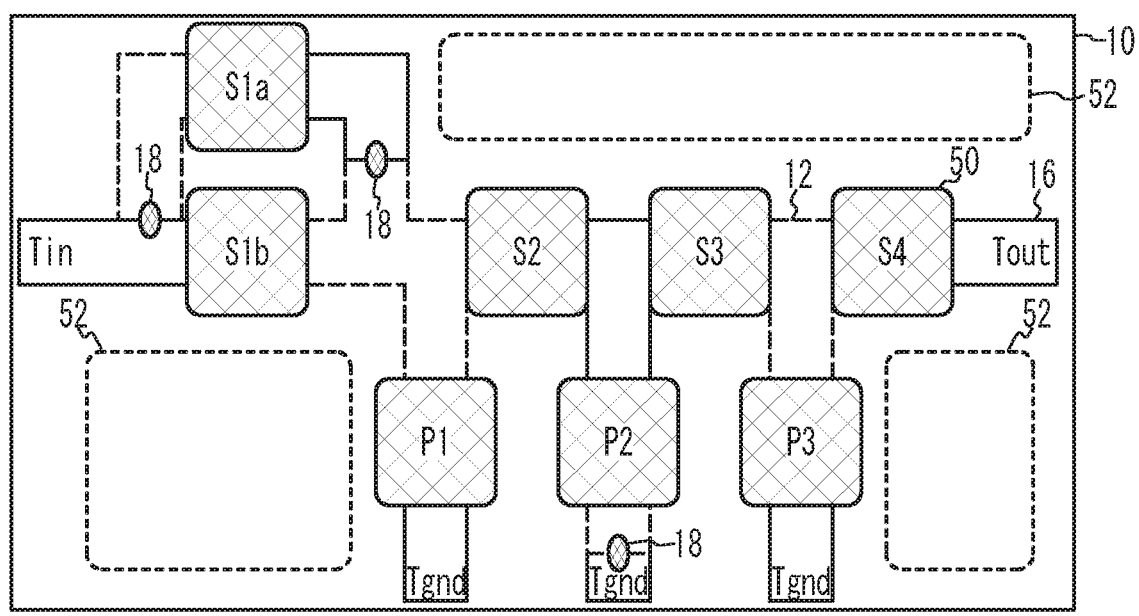
FIG. 19 is a plan view of an acoustic wave device in accordance with the first variation of the second embodiment.

FIG. 19 is a plan view of an acoustic wave device in accordance with the first variation of the second embodiment. As illustrated in FIG. 19, the through electrode 18 connects the lower electrode 12 and the upper electrode 16 between the resonators S1a and S1b. Other structures are the same as those of the first embodiment illustrated in FIG. 2, and the description thereof is thus omitted.

In the first variation of the second embodiment, at least one (e.g., the series resonator S1) of the series resonators S1 through S4 and the parallel resonators P1 through P3 is divided into the resonators S1a and S1b in parallel. When the resonators S1a and S1b are viewed from one (e.g., the input terminal Tin) of the two nodes, the polarization direction 56a of the piezoelectric substrate 14 of the resonator S1a is opposite to the polarization direction 56b of the piezoelectric substrate 14 of the resonator S1b. Accordingly, second harmonic distortion is reduced.

In the second embodiment and the first variation thereof, to further reduce the second harmonic distortion, the areas of the resonance regions 50 of the divided resonators (for example, S1a and S1b) are preferably approximately equal to each other to the extent of production errors. Additionally, the thicknesses of the piezoelectric substrates 14 of the divided resonators (for example, S1a and S1b) are preferably approximately equal to each other to the extent of production errors.

In the first and second embodiments and the variations thereof, the number of series resonators and the number of parallel resonators can be freely selected. The ladder-type filter has been described as an example of the filter, but the filter may be a multimode filter.

Third Embodiment

Figure 20:
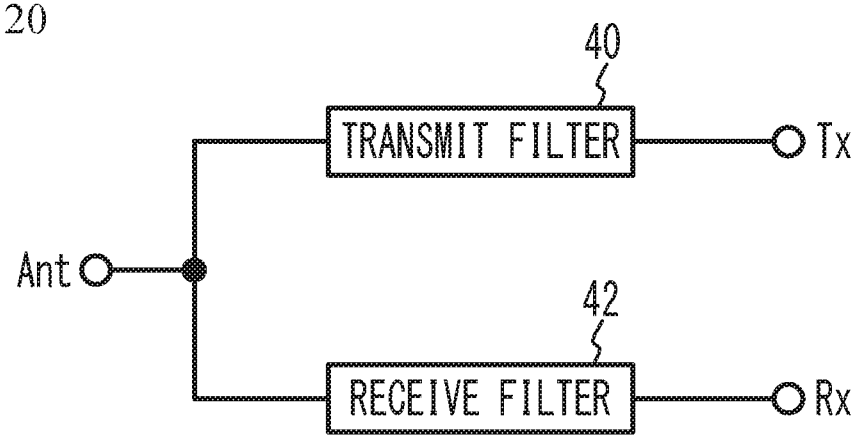
FIG. 20 is a circuit diagram of a duplexer in accordance with a third embodiment.

FIG. 20 is a circuit diagram of a duplexer in accordance with a third embodiment. As illustrated in FIG. 20, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among high-frequency signals input from the transmit terminal Tx, and suppresses signals with other frequencies. The receive filter 42 transmits signals in the receive band to the receive terminal Rx as reception signals among high-frequency signals input from the common terminal Ant, and suppresses signals with other frequencies. At least one of the transmit filter 40 and the receive filter 42 may be the filter according to any one of the first and second embodiments and the variations thereof.

The duplexer has been described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
a support substrate;
a single piezoelectric substrate that is located on the support substrate and is single-crystal;
first electrodes located on a first surface of the piezoelectric substrate;
second electrodes located on a second surface of the piezoelectric substrate; and
an acoustic mirror that is located on the support substrate, is located between the support substrate and the first electrodes in resonance regions where the first electrodes and the second electrodes face each other across at least a part of the piezoelectric substrate, is not located between the support substrate and the first electrodes in at least a part of a region between the resonance regions, and reflects an acoustic wave propagating through the piezoelectric substrate,
wherein an air gap is located between the support substrate and the piezoelectric substrate in the at least a part of the region between the resonance regions.

2. The acoustic wave device according to claim 1, wherein the piezoelectric substrate is a lithium tantalate substrate or a lithium niobate substrate.

3. The acoustic wave device according to claim 1, wherein the piezoelectric substrate includes a first substrate and a second substrate that are stacked, polarization directions of the first substrate and the second substrate being opposite to each other.

4. The acoustic wave device according to claim 1, further comprising:
piezoelectric thin film resonators corresponding to the resonance regions, wherein
a part of the first electrodes located on the first surface of the piezoelectric substrate and/or a part of the second electrodes located on the second surface of the piezoelectric substrate electrically connects between the piezoelectric thin film resonators, and the piezoelectric thin film resonators include one or more series resonators connected in series between an input terminal and an output terminal and one or more parallel resonators connected in parallel between the input terminal and the output terminal.

5. The acoustic wave device according to claim 4, wherein at least one of the one or more series resonators and the one or more parallel resonators is divided into a first resonator and a second resonator in series or in parallel between two nodes, and when the first resonator and the second resonator are viewed from one of the two nodes, a polarization direction of the piezoelectric substrate of the first resonator is opposite to a polarization direction of the piezoelectric substrate of the second resonator.

6. The acoustic wave device according to claim 4, wherein at least one of the one or more series resonators and the one or more parallel resonators is divided into a first resonator and a second resonator in series between two nodes, when the first resonator and the second resonator are viewed from one of the two nodes, a polarization direction of the piezoelectric substrate of the first resonator is opposite to a polarization direction of the piezoelectric substrate of the second resonator, all the input terminal, the output terminal, and a ground terminal connected to the one or more parallel resonators are located on the second surface, and a through electrode penetrating through the piezoelectric substrate and connecting at least one of the first electrodes and at least one of the second electrodes is not provided.

7. An acoustic wave device comprising:

a support substrate;

a single piezoelectric substrate that is located on the support substrate and is single-crystal;

first electrodes located on a first surface of the piezoelectric substrate;

second electrodes located on a second surface of the piezoelectric substrate;

an acoustic mirror that is located on the support substrate, is located between the support substrate and the first electrodes in resonance regions where the first electrodes and the second electrodes face each other across at least a part of the piezoelectric substrate, is not located between the support substrate and the first electrodes in at least a part of a region between the resonance regions, reflects an acoustic wave propagating through the piezoelectric substrate, and includes a first film and a second film alternately stacked, an acoustic impedance of the second film being higher than an acoustic impedance of the first film, an insulator film that is located between the support substrate and the piezoelectric substrate in the at least a part of the region between the resonance regions, is made of a different material from the acoustic mirror, and has a Young's modulus less than Young's modulus of the first film and the second film.

8. The acoustic wave device according to claim 7, wherein:

the piezoelectric substrate is a lithium tantalate substrate or a lithium niobate substrate.

9. The acoustic wave device according to claim 7, wherein:

the piezoelectric substrate includes a first substrate and a second substrate that are stacked, polarization directions of the first substrate and the second substrate being opposite to each other.

10. The acoustic wave device according to claim 7, further comprising:

piezoelectric thin film resonators corresponding to the resonance regions, wherein a part of the first electrodes located on the first surface of the piezoelectric substrate and/or a part of the second electrodes located on the second surface of the piezoelectric substrate electrically connects between the piezoelectric thin film resonators, and the piezoelectric thin film resonators include one or more series resonators connected in series between an input terminal and an output terminal and one or more parallel resonators connected in parallel between the input terminal and the output terminal.

11. The acoustic wave device according to claim 10, wherein at least one of the one or more series resonators and the one or more parallel resonators is divided into a first resonator and a second resonator in series or in parallel between two nodes, and when the first resonator and the second resonator are viewed from one of the two nodes, a polarization direction of the piezoelectric substrate of the first resonator is opposite to a polarization direction of the piezoelectric substrate of the second resonator.

12. The acoustic wave device according to claim 10, wherein at least one of the one or more series resonators and the one or more parallel resonators is divided into a first resonator and a second resonator in series between two nodes, when the first resonator and the second resonator are viewed from one of the two nodes, a polarization direction of the piezoelectric substrate of the first resonator is opposite to a polarization direction of the piezoelectric substrate of the second resonator, all the input terminal, the output terminal, and a ground terminal connected to the one or more parallel resonators are located on the second surface, and a through electrode penetrating through the piezoelectric substrate and connecting at least one of the first electrodes and at least one of the second electrodes is not provided.

13. A filter comprising the acoustic wave device according to 7.

14. An acoustic wave device comprising:

a support substrate;

a single piezoelectric substrate that is located on the support substrate and is single-crystal;

first electrodes located on a first surface of the piezoelectric substrate;

second electrodes located on a second surface of the piezoelectric substrate; and an acoustic mirror that is located on the support substrate, is located between the support substrate and the first electrodes in resonance regions where the first electrodes and the second electrodes face each other across at least a part of the piezoelectric substrate, is not located between the support substrate and the first electrodes in at least a part of a region between the resonance regions, and reflects an acoustic wave propagating through the piezoelectric substrate, wherein the first surface in a first region where the first electrodes are located and the first surface in a second region where the first electrodes are not located are flat.

15. The acoustic wave device according to claim 14, wherein the piezoelectric substrate is a lithium tantalate substrate or a lithium niobate substrate.

16. The acoustic wave device according to claim 14, wherein the piezoelectric substrate includes a first substrate and a second substrate that are stacked, polarization directions of the first substrate and the second substrate being opposite to each other.

17. The acoustic wave device according to claim 14, further comprising:
piezoelectric thin film resonators corresponding to the resonance regions, wherein:
a part of the first electrodes located on the first surface of the piezoelectric substrate and/or a part of the second electrodes located on the second surface of the piezoelectric substrate electrically connects between the piezoelectric thin film resonators, and
the piezoelectric thin film resonators include one or more series resonators connected in series between an input terminal and an output terminal and one or more parallel resonators connected in parallel between the input terminal and the output terminal.

18. The acoustic wave device according to claim 17, wherein:
at least one of the one or more series resonators and the one or more parallel resonators is divided into a first resonator and a second resonator in series or in parallel between two nodes, and
when the first resonator and the second resonator are viewed from one of the two nodes, a polarization direction of the piezoelectric substrate of the first resonator is opposite to a polarization direction of the piezoelectric substrate of the second resonator.

19. The acoustic wave device according to claim 17, wherein:
at least one of the one or more series resonators and the one or more parallel resonators is divided into a first resonator and a second resonator in series between two nodes,
when the first resonator and the second resonator are viewed from one of the two nodes, a polarization direction of the piezoelectric substrate of the first resonator is opposite to a polarization direction of the piezoelectric substrate of the second resonator,
all the input terminal, the output terminal, and a ground terminal connected to the one or more parallel resonators are located on the second surface, and
a through electrode penetrating through the piezoelectric substrate and connecting at least one of the first electrodes and at least one of the second electrodes is not provided.

20. A filter comprising the acoustic wave device according to 14.

* * * * *